(12) United States Patent
Kim et al.

(10) Patent No.: US 10,392,701 B2
(45) Date of Patent: *Aug. 27, 2019

(54) SUPERHYDROPHOBIC COATING MATERIAL AND METHOD FOR MANUFACTURING THE SAME

(71) Applicants: Industry-Academic Cooperation Foundation, Yonsei University, Seoul (KR); Incheon University Industry Academic Cooperation Foundation, Incheon (KR)

(72) Inventors: Hyungjun Kim, Seoul (KR); Il-Kwon Oh, Seoul (KR); Han-Bo-Ram Lee, Seoul (KR)

(73) Assignee: Industry-Academic Cooperation Foundation, Yonsei University, Incheon (KR)

( * ) Notice: Subject to any disclaimer, the term of this patent is extended or adjusted under 35 U.S.C. 154(b) by 257 days.

This patent is subject to a terminal disclaimer.

(21) Appl. No.: 14/815,797

(22) Filed: Jul. 31, 2015

(65) Prior Publication Data

US 2016/0032448 A1 Feb. 4, 2016

(30) Foreign Application Priority Data

Aug. 1, 2014 (KR) .................. 10-2014-0098866

(51) Int. Cl.
*C23C 16/455* (2006.01)
*C23C 16/40* (2006.01)
*C23C 16/04* (2006.01)
*B08B 17/06* (2006.01)

(52) U.S. Cl.
CPC ...... *C23C 16/45525* (2013.01); *C23C 16/045* (2013.01); *C23C 16/40* (2013.01);
(Continued)

(58) Field of Classification Search
CPC ............ C23C 16/45525–45555; C09D 5/1681
(Continued)

(56) References Cited

U.S. PATENT DOCUMENTS

| | | | | |
|---|---|---|---|---|
| 2003/0072882 A1* | 4/2003 | Niinisto | ......... | C23C 16/40 |
| | | | | 427/255.28 |
| 2013/0251942 A1* | 9/2013 | Azimi | ......... | C04B 35/50 |
| | | | | 428/141 |
| 2016/0032163 A1* | 2/2016 | Kim | ......... | C09K 3/18 |
| | | | | 427/301 |

FOREIGN PATENT DOCUMENTS

| | | |
|---|---|---|
| JP | 4921652 | 4/2012 |
| WO | 2009/149372 | 12/2009 |
| WO | 2013/141877 | 9/2013 |

OTHER PUBLICATIONS

Lee, J.S., et al., "Atomic Layer Deposition of Y2O3 and Yttrium-Doped HfO2 Using a Newly Synthesized Y(iPrCp)2(N-iPr-amd) Precursor for a High Permittivity Gate Dielectric", 2014, Appl. Surf. Sci., 297, p. 16-21 (Year: 2014).*

(Continued)

*Primary Examiner* — Jennifer A Steele
(74) *Attorney, Agent, or Firm* — Procopio, Cory, Hargreaves & Savitch LLP

(57) ABSTRACT

The present disclosure relates to a superhydrophobic coating material and a method for manufacturing the superhydrophobic coating material. The superhydrophobic coating material according to the present disclosure includes a substrate provided with a three-dimensional nano structure; and a coating layer comprising a rare earth metal oxide formed on the three-dimensional nano structure. The method for manufacturing the superhydrophobic coating material according to the present disclosure includes preparing a substrate provided with a three-dimensional nano structure; and forming a coating layer comprising a rare earth metal
(Continued)

oxide on the three-dimensional nano structure by supplying a precursor including a rare earth metal and an oxidant one by one onto the substrate, and the temperature of the substrate is controlled in the forming step so that an atomic ratio of a carbon element in the coating layer is less than 1% to form the coating layer with superhydrophobic property.

2 Claims, 23 Drawing Sheets

(52) U.S. Cl.
CPC ...... *C23C 16/405* (2013.01); *C23C 16/45555* (2013.01); *B08B 17/065* (2013.01)

(58) Field of Classification Search
USPC ...... 427/248.1, 255.28, 255.29, 255.31, 569, 427/576, 250, 252
See application file for complete search history.

(56) References Cited

OTHER PUBLICATIONS

Notice of Grounds of Rejection for KR App No. 10-2014-0098866 dated Oct. 2, 2015, 10 pgs.
Azimi, G., et al., Hydrophobicity of Rare-Earth Oxide Ceramics, Nature Materials Letters (Jan. 20, 2013), Published online: Jan. 20, 2013, 20 pages.
Niinisto, L., Atomic Layer Deposition of Rare Earth Oxides, Helsinki University of Technology, Laboratory of Inorganic and Analytical Chemistry, Jun. 14, 2005, 24 pgs.
Oh, I-K., et al., Hydrophobicity of Rare Earth Oxides Grown by Atomic Layer Deposition, Chemistry of Materials, Jan. 27, 2015, pp. 148-156.

* cited by examiner

SUPERHYDROPHOBIC COATING MATERIAL AND METHOD FOR MANUFACTURING THE SAME

TECHNICAL FIELD

The present disclosure herein relates to a superhydrophobic coating material and a method for manufacturing the same.

This invention was derived from studies conducted as a part for developing fundamental technology of industrial fusion by the Ministry of knowledge economy (project number 2012-8-1046, development on high density plasma technique for depositing an inorganic thin film for processing an ultrafine semiconductor and a flexible display).

BACKGROUND ART

The requirement on a hydrophobic coating material in many fields including automobile parts and products for cooking is increasing. Recently, a hydrophobic coating material using hydrocarbon receives spotlight. Hydrocarbon has merits of small surface energy, small friction-resistance and abrasion-resistance. However, at the temperature of 250° C. and more, dehydrogenation reaction is gradually generated in a hydrocarbon hydrophobic material, and the properties of the material are markedly deteriorated.

DESCRIPTION OF THE INVENTION

Technical Problem

The present disclosure provides a coating material having superhydrophobic property and maintaining the superhydrophobic property after heat treatment at a high temperature, and a method for manufacturing the same.

The present disclosure also provides a coating material having superhydrophobic property and a method for manufacturing the same by an atomic layer deposition method.

The present disclosure also provides a superhydrophobic coating material having good step coverage property and a method for manufacturing the same.

Technical Solution

An embodiment of the inventive concept provides a superhydrophobic coating material including a substrate provided with a three-dimensional nano structure; and a coating layer on the three-dimensional nano structure, the coating layer including a rare earth metal oxide.

In an embodiment of the inventive concept, the superhydrophobic coating material may have a contact angle with water of greater than 150° and superhydrophobic property.

In an embodiment of the inventive concept, the superhydrophobic coating material may maintain superhydrophobic property after heat treatment at a temperature of 500° C. for 2 hours in air.

In an embodiment of the inventive concept, the coating layer may include at least one rare earth metal oxide selected from $Y_2O_3$, $Dy_2O_3$, $La_2O_3$, $CeO_2$, and $Er_2O_3$.

In an embodiment of the inventive concept, the three-dimensional nano structure may include a plurality of three-dimensional nano wires arranged in one direction.

In an embodiments of the inventive concept, a method for manufacturing a superhydrophobic coating material includes preparing a substrate provided with a three-dimensional nano structure; and forming a coating layer including a rare earth metal oxide on the three-dimensional nano structure by supplying a precursor including a rare earth metal and an oxidant one by one onto the substrate.

In an embodiment of the inventive concept, the forming of the coating layer may include (a) supplying the precursor including the rare earth metal onto the substrate; (b) purging impurities of remaining precursor after the combination of the rare earth metal onto the substrate; (c) supplying the oxidant onto the substrate; and (d) purging remaining impurities after forming the coating layer including the rare earth metal oxide on the substrate.

In an embodiment of the inventive concept, the method for manufacturing a superhydrophobic coating material may form a coating layer with superhydrophobic property by repeating the steps of (a) to (d).

In an embodiment of the inventive concept, the oxidant may include at least one selected from $H_2O$ and plasma $O_2$.

In an embodiment of the inventive concept, the forming of the coating layer may be conducted by controlling the temperature of the substrate so that an atomic ratio of a carbon element in the coating layer may be less than 1% to form a coating layer with superhydrophobic property.

In an embodiment of the inventive concept, the rare earth metal includes yttrium, and the forming of the coating layer may be conducted by controlling the temperature of the substrate to 160 to 200° C. so that an atomic ratio of a carbon element in the coating layer may be less than 1% to form a coating layer with superhydrophobic property.

In an embodiment of the inventive concept, the rare earth metal may include dysprosium, and the forming of the coating layer may be conducted by controlling the temperature of the substrate to 145 to 230° C. so that an atomic ratio of a carbon element in the coating layer is less than 1% to form a coating layer with superhydrophobic property.

In an embodiment of the inventive concept, the rare earth metal may include erbium, and the forming of the coating layer may be conducted by controlling the temperature of the substrate to 180 to 250° C. so that an atomic ratio of a carbon element in the coating layer may be less than 1% to form a coating layer with superhydrophobic property.

In an embodiment of the inventive concept, the rare earth metal may include lanthanum, and the forming of the coating layer may be conducted by controlling the temperature of the substrate to 250 to 350° C. so that an atomic ratio of a carbon element in the coating layer may be less than 1% to form a coating layer with superhydrophobic property.

In an embodiment of the inventive concept, the rare earth metal may include cerium, and the forming of the coating layer may be conducted by controlling the temperature of the substrate to 200 to 300° C. so that an atomic ratio of a carbon element in the coating layer may be less than 1% to form a coating layer with superhydrophobic property.

In an embodiment of the inventive concept, a contact angle of the coating layer with water may be greater than 150°, and superhydrophobic property may be maintained after heat treatment at a temperature of 500° C. for 2 hours.

Effects of the Invention

According to an embodiment of the inventive concept, a coating material having superhydrophobic property and maintaining the superhydrophobic property after heat treatment at a high temperature may be provided.

In addition, according to an embodiment of the inventive concept, a coating material having good step coverage property and hydrophobic property may be manufactured by an atomic layer deposition method.

The effects of the inventive concept are not limited thereto. Unmentioned effects may be clearly understood by a person skilled in the art from the description and attached drawings.

DETAILED DESCRIPTION FOR CARRYING OUT THE INVENTION

Figure 1:
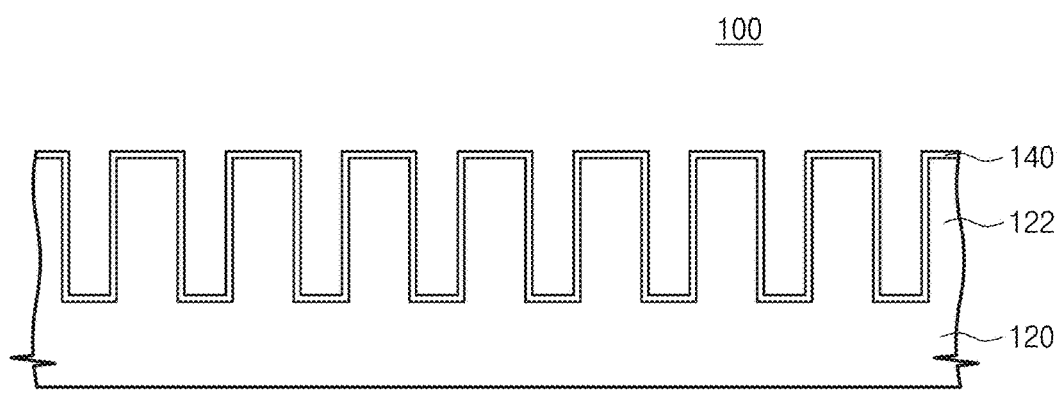
FIG. 1 is a cross-sectional view schematically illustrating a superhydrophobic coating material according to an embodiment of the inventive concept.

The advantages and the features of the inventive concept, and methods for attaining them will be described in example embodiments below with reference to the accompanying drawings. The inventive concept may, however, be embodied in different forms and should not be construed as limited to the embodiments set forth herein. Rather, the inventive concept may be defined by the scope of claims. It will be further understood that terms (including technical or scientific terms) should be interpreted as having a meaning that is consistent with their meaning in the context of the relevant art.

In the drawings, like reference numerals refer to like elements throughout so far as possible. General explanation on known elements may be omitted so as not to obscure the gist of the inventive concept. It will also be understood that when a material is referred to as being "formed on ~" another material, it can be directly on the other material, or intervening materials may also be present.

The superhydrophobic coating material according to an embodiment of the inventive concept includes a substrate provided with a three-dimensional nano structure and a coating layer of a rare earth metal oxide formed on the three-dimensional nano structure. That is, a coating material having superhydrophobic property may be obtained by forming a rare earth metal oxide coating layer on a substrate provided with a three-dimensional nano structure. In the method for manufacturing a superhydrophobic coating material according to an embodiment of the inventive concept, the growing temperature (the temperature of a substrate) of the rare earth metal oxide is controlled so that the atomic ratio of a carbon element in the coating layer may be less than 1% to form a coating layer having superhydrophobic property. That is, the temperature of the substrate is controlled so that the atomic ratio of a carbon element in the coating layer is less than 1% to form a coating layer having superhydrophobic property on a three-dimensional nano structure by an atomic layer deposition method.

FIG. 1 is a cross-sectional view schematically illustrating a superhydrophobic coating material according to an embodiment of the inventive concept. Referring to FIG. 1, a superhydrophobic coating material 100 according to an embodiment includes a substrate (120) provided with a three-dimensional nano structure (122) and a coating layer (140) formed on the substrate (120). The substrate (120) may be a substrate having a three-dimensional nano structure thereon. The three-dimensional nano structure may include a plurality of nano wire structures arranged (aligned) in one direction.

The substrate (120) may be, for example, a silicon substrate, a germanium substrate, a multi-element substrate such as GaAs, AlGaAs, and InAlGaAs substrates, or a glass substrate, without limitation. For example, the substrate (120) may be a bulk substrate or a silicon on insulator (SOI) substrate in which n-type or p-type impurities are entirely or partially doped.

The coating layer (140) includes a rare earth metal oxide. In an embodiment, the coating layer (140) may be formed as an atomic layer unit on the three-dimensional nano structure (122). The coating layer (140) may include, for example, at least one rare earth metal oxide of $Y_2O_3$, $Dy_2O_3$, $La_2O_3$, $CeO_2$ or $Er_2O_3$. The coating layer (140) may be transparent and may have superhydrophobic property of which contact angle with water is greater than 150°, because the atomic ratio of a carbon element among elements forming the coating layer (140) is less than 1%.

The coating layer (140) may be formed on the substrate (120) by an atomic layer deposition method. The coating layer (140) may be a single atomic layer or may be formed using two or more atomic layers. Different from FIG. 1, another layer (not shown) may be further formed between the substrate (120) and the coating layer (140). The superhydrophobic coating material according to an embodiment of the inventive concept has thermal stability at a high temperature and maintains superhydrophobic property after heat treatment at 500° C. for 2 hours.

The method for manufacturing a superhydrophobic coating material according to an embodiment of the inventive concept includes a step of preparing a substrate (120) provided with a three-dimensional nano structure (122); and a step of forming a coating layer (140) including a rare earth metal oxide on the three-dimensional nano structure 122 by supplying a precursor including a rare earth metal and an oxidant one by one onto the substrate (120).

Figure 2A:
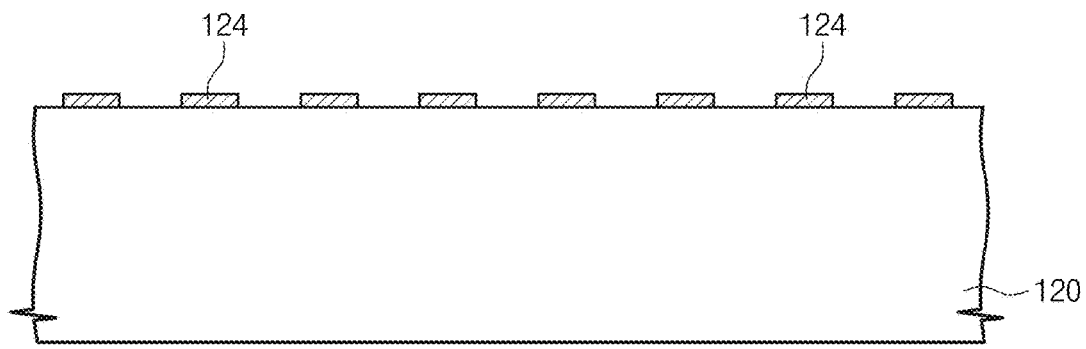
FIGS. 2A to 2C are cross-sectional views for explaining a process of manufacturing a substrate provided with a three-dimensional nano structure.
Figure 2B:
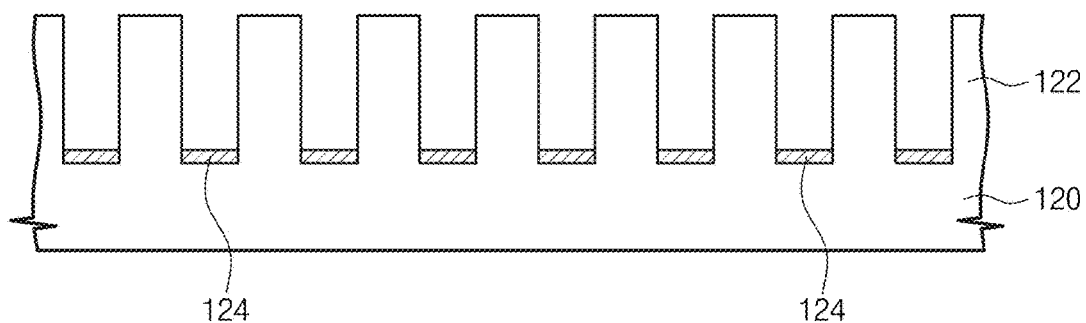
Figure 2C:
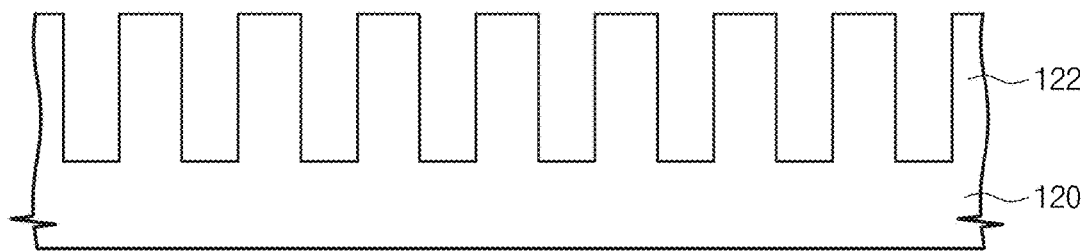

FIGS. 2A to 2C are cross-sectional views for explaining a process of manufacturing a substrate provided with a three-dimensional nano structure. For example, the three-dimensional nano structure (122) may be formed on the substrate (120) via wet etching (metal assisted chemical etching) using a metal catalyst (124). As shown in FIG. 2A, the metal catalyst (124) is deposited on the substrate (120) to etch the upper portion of the substrate (120) to obtain a predetermined pattern corresponding to the three-dimensional nano structure. The metal catalyst (124) may include, for example, noble metals such as gold (Au), silver (Ag), platinum (Pt), and palladium (Pd) or other materials that may etch the substrate (10) by metal assisted chemical etching.

Then, the substrate (120) on which the metal catalyst (124) is formed is immersed in an etching solution, and the upper portion of the substrate (120) may be etched according to the pattern of the metal catalyst (124) via the chemical reaction of the etching solution with the metal catalyst (124) as shown in FIG. 2B. As the etching solution, for example, a solution obtained by mixing an oxidant, an acid, and deionized water may be used. For example, an etching solution obtained by mixing hydrogen fluoride (HF), hydrogen peroxide ($H_2O_2$), and water ($H_2O$), or an etching solution obtained by mixing sulfuric acid ($H_2SO_4$), potassium permanganate ($KMnO_4$), and water ($H_2O$) may be used, without limitation.

After that, the substrate (120) provided with the three-dimensional nano structure (122) as shown in FIG. 2C may be obtained by removing the metal catalyst (124) from the substrate (120) using an etching solution for removing the metal catalyst (124). Of course, the method for forming the three-dimensional structure shown in FIGS. 2A to 2C is an illustration, and the three-dimensional nano structure (122) may be formed on the substrate (120) by other methods.

Figure 3:
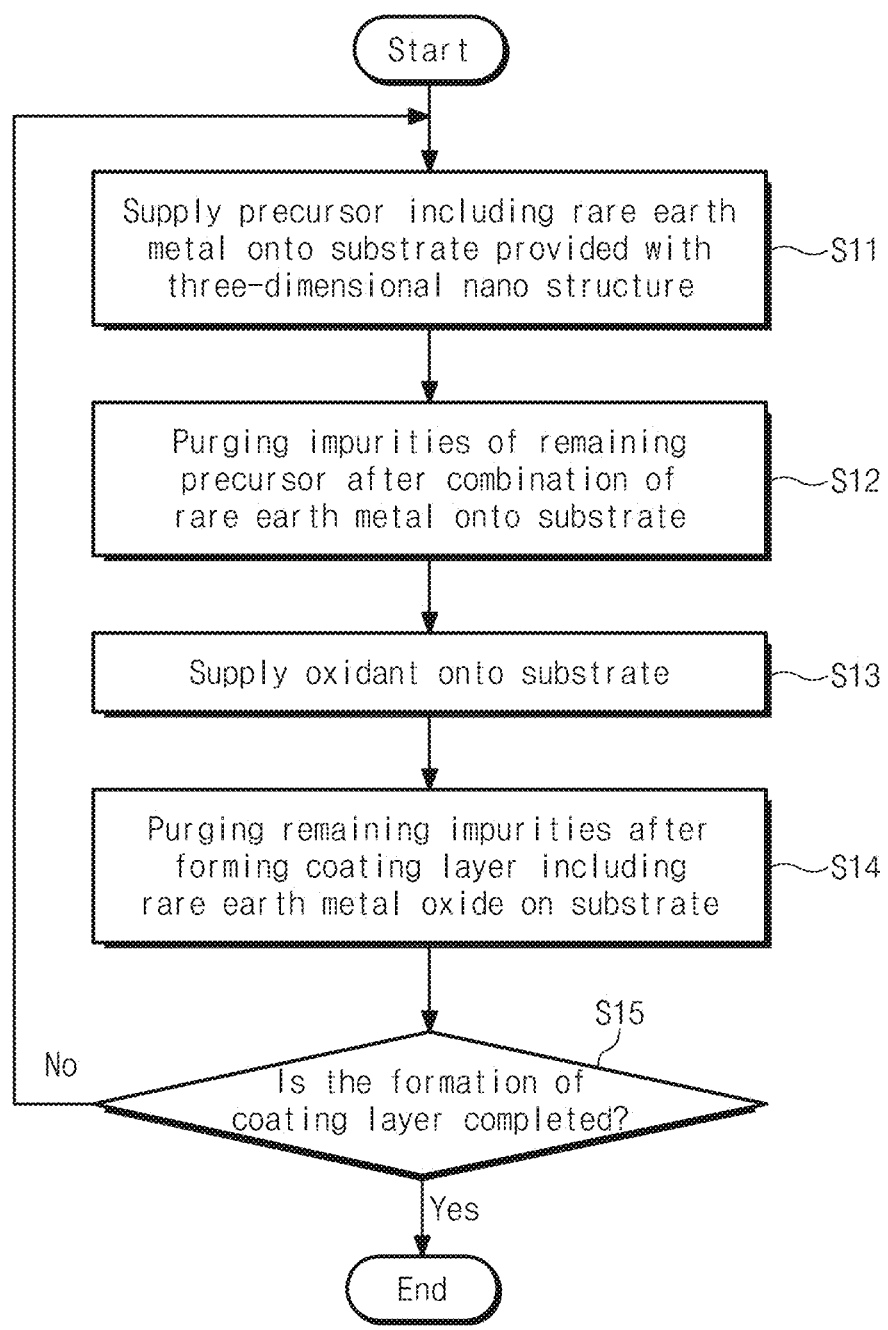
FIG. 3 is a flowchart for showing a process of forming a coating layer on a substrate on which a three-dimensional nano structure is formed according to an embodiment of the inventive concept.

Then, the coating layer (140) is formed on the substrate (120) provided with the three-dimensional nano structure (122) to manufacture the superhydrophobic coating material (100) as shown in FIG. 1. FIG. 3 is a flowchart for showing a process of forming a coating layer on a substrate on which a three-dimensional nano structure is formed according to an embodiment of the inventive concept. Referring to FIGS. 1 and 3, the process of forming the coating layer on the three-dimensional nano structure (122) includes a step of supplying a precursor including a rare earth metal onto the substrate (120) provided with a three-dimensional nano structure (122) (S11), a step of purging impurities of a remaining precursor after the combination of the rare earth metal onto the substrate 120 (S12), a step of supplying an oxidant onto the substrate 120 (S13), and a step of purging remaining impurities after forming the coating layer (140) including the rare earth metal oxide (S14).

The impurity may include impurity elements such as carbon and nitrogen. In order to form the coating layer (140) having superhydrophobic property, the temperature of the substrate (120) is controlled in steps S11 to S14 so that the atomic ratio of a carbon element in the coating layer (140) is less than 1%. According to an embodiment of the inventive concept, a rare earth oxide coating layer is formed on the substrate provided with the three-dimensional structure and a superhydrophobic surface may be attained. In addition, the superhydrophobic property may be maintained after heat treatment at a high temperature or may be improved when compared to that before the heat treatment at a high temperature. According to an embodiment, a coating layer having high step coverage property may be formed, and a coated surface having transparency, superhydrophobic property and thermal stability may be obtained.

Exemplary embodiments of the inventive concept will be explained in more detail. First, a substrate (120) provided with a three-dimensional nano structure (122) is introduced in a reaction chamber of an atomic layer deposition apparatus. In order to form a coating layer (140) having superhydrophobic property, the temperature of the substrate (120) may be controlled in advance so that the atomic ratio of a carbon element in the coating layer (140) to be formed on the substrate (120) is less than 1%. The temperature of the substrate (120) for forming the coating layer (140) having superhydrophobic property may be changed according to a precursor including a rare earth metal oxide, which will be explained later. For example, the temperature of the substrate (120) may be controlled by using a heater or other means for heating the substrate. The method for controlling the temperature of the substrate (120) is not specifically limited, and various heating methods including conduction, convection, and radiation may be used.

Referring to FIG. 3 again, a precursor including a rare earth metal is supplied into a reaction chamber of an atomic layer deposition apparatus (S11). In an embodiment of the inventive concept, the precursor supplied onto the substrate (120) may include at least one rare earth metal of yttrium (Y), dysprosium (Dy), erbium (Er), lanthanum (La) or cerium (Ce). The precursor may include, for example, at least one of $Y(iPrCp)_2$(N-iPr-amd), $Dy(iPrCp)_2$(N-iPr-amd), $Er(MeCp)_2$(N-iPr-amd), $La(iPrCp)_3$, or $Ce(iPrCp)_3$.

After exposing the substrate (120) to the precursor for a predetermined time period in the step of S11, impurities of a remaining precursor after the combination of the rare earth metal onto the substrate (120) is purged (S12). In this case, the impurities of the precursor may include, for example, isopropylcyclopentadienyl (iPrCp), N-isopropyl-acetamidinate (N-iPr-amd), or methylcyclopentadienyl (MeCp) forming the precursor, or impurity elements separated therefrom such as carbon and nitrogen.

After purging the impurities for a predetermined time period in the step of S12, an oxidant is supplied onto the substrate (120) (S13). The oxidant may include at least one of $H_2O$ or plasma $O_2$. In an embodiment of the inventive concept, in the case of using an yttrium precursor or an erbium precursor as the precursor, the $H_2O$ oxidant may be used. In the case of using a precursor including dysprosium or cerium, the plasma $O_2$ oxidant may be used. In the case of using a precursor including lanthanum, the $H_2O$ or plasma $O_2$ oxidant may be used.

After exposing the substrate (120) to the oxidant for a predetermined time period in the step of S13, remaining impurities after forming the coating layer including the rare earth metal oxide on the substrate (120) is purged for a predetermined time period (S14). The purged impurities may include, for example, isopropylcyclopentadienyl (iPrCp), N-isopropyl-acetamidinate (N-iPr-amd), or methylcyclopentadienyl (MeCp) forming the precursor, carbon, nitrogen, unreacted and remaining oxidant, or impurity elements such as hydrogen separated from the oxidant.

One cycle of the forming process of the coating layer via the steps of S11 to S14 is conducted. The steps of S11 to S14 may be repeated for a predetermined number of times. That is, if further formation of the coating layer by an atomic layer unit is judged to be necessary in the step of S15, the process of the steps of S11 to S14 may be repeatedly conducted, and the coating layer (140) including the rare earth metal oxide (for example, $Y_2O_3$, $Dy_2O_3$, $La_2O_3$, $CeO_2$ or $Er_2O_3$) may be formed on the substrate (120) via conducting the forming process of the coating layer for several tens of times.

Figure 4:
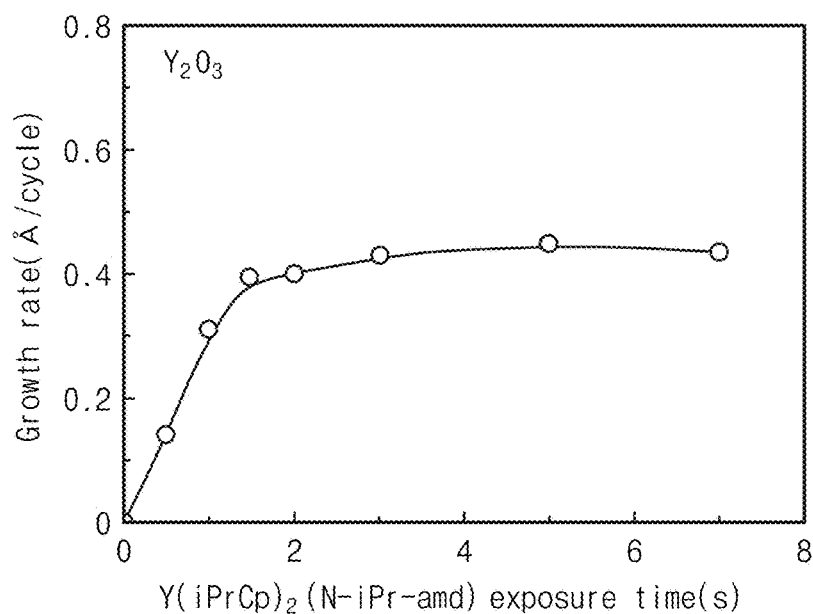
FIG. 4 is a graph showing a growth rate of an yttrium oxide coating layer relative to exposure time of a substrate to an yttrium precursor.

FIG. 4 is a graph showing a growth rate of an yttrium oxide coating layer relative to exposure time of a substrate to an yttrium precursor. An Si substrate was exposed to a $Y(iPrCp)_2$(N-iPr-amd) precursor in the step of S11, the substrate was exposed to an $H_2O$ oxidant for 1 second to form an yttrium metal oxide coating layer in the step of S13, and the purging time period of the steps of S12 and S14 was set to 10 seconds, respectively. The temperature of the substrate (120) was maintained at 180° C., and the bubbling temperature of the precursor and the oxidant was set to 130° C.

As shown in FIG. 4, if the exposure time to the precursor is greater than 1.5 seconds, the growth rate of the yttrium metal oxide coating layer per cycle is maintained to an appropriate level (about 0.4 Å/cycle). To secure the growth rate of the coating layer to a certain level while decreasing processing time, the exposure time to the yttrium precursor may preferably be from 1.5 to 2 seconds.

Figure 5:
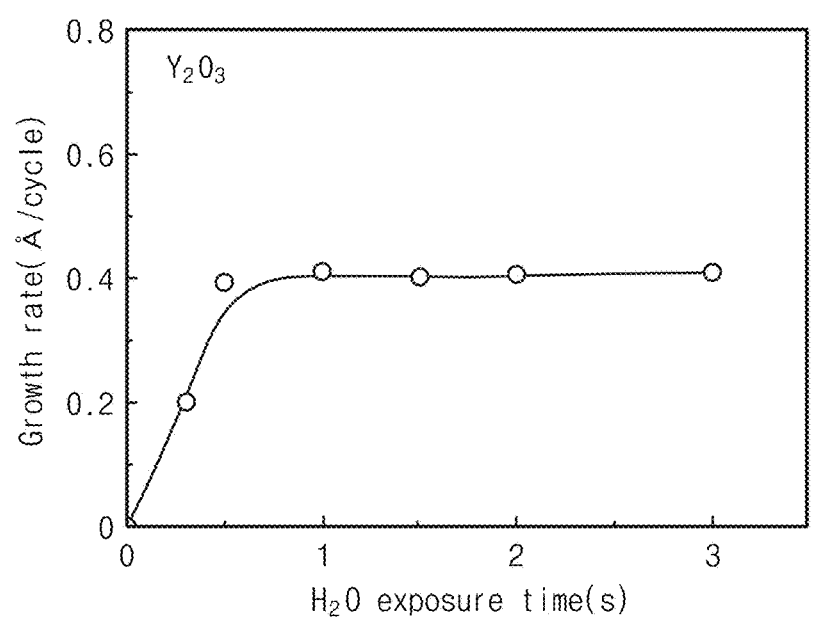
FIG. 5 is a graph showing a growth rate of an yttrium oxide coating layer relative to exposure time of a substrate to an oxidant.

FIG. 5 is a graph showing a growth rate of an yttrium oxide coating layer relative to exposure time of a substrate to an oxidant. The exposure time to the yttrium precursor was set to 2 seconds, and other experimental conditions were the same as those of FIG. 4. As shown in FIG. 5, if the exposure time to the oxidant was greater than or equal to 0.5 seconds, the growth rate of the yttrium metal oxide coating layer per cycle was maintained to an appropriate level (about 0.4 Å/cycle). To secure the growth rate of the coating layer to a certain level while decreasing processing time, the exposure time to the oxidant may preferably be from 0.5 seconds to 1 second.

Figure 6:
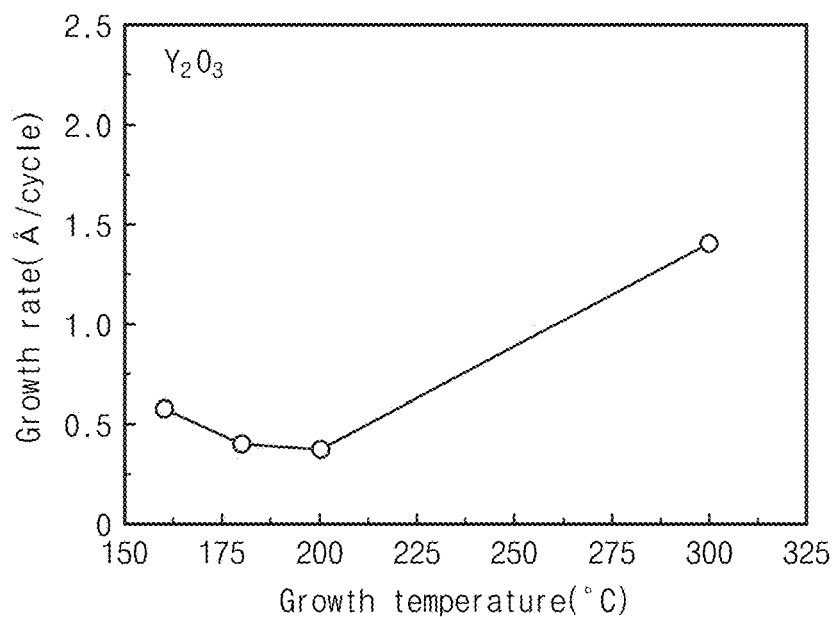
FIG. 6 is a graph showing a growth rate of an yttrium oxide coating layer relative to the growth temperature (the temperature of a substrate) of a coating layer.

FIG. 6 is a graph showing a growth rate of an yttrium oxide coating layer relative to the growth temperature (the temperature of a substrate) of a coating layer. The supply time (exposure time) of the precursor was set to 2 seconds, the exposure time to the oxidant was set to 1 second, and other experimental conditions were the same as those of FIG. 4. As shown in FIG. 6, in the case of using the yttrium precursor and in the case of the temperature of the substrate being in a range of 160 to 200° C., the growth rate of the coating layer was secured to an appropriate level.

In the case of setting the temperature of the substrate (120) to the temperature (300° C.) greater than 200° C., the growth rate of the yttrium oxide coating layer excessively increases. This is due to the inclusion of impurities other than yttrium oxide in the coating layer. That is, if the temperature of the substrate (120) is greater than 200° C., the atomic ratio of a carbon element in the elements constituting the coating layer increases to greater than or equal to 1%, and the coating layer (140) thus formed may not have superhydrophobic property.

More preferable temperature of the substrate (120) for forming the yttrium oxide coating layer is from 180 to 200° C. In the case of maintaining the temperature of the substrate (120) at 160° C., the yttrium oxide coating layer may also have superhydrophobic property, however the growth rate of the coating layer (140) may be somewhat higher when compared to the case of maintaining the temperature of the substrate (120) at 180° C. That is, the atomic ratio of a carbon element in the coating layer (140) is increased to the proximate level of 1%. In the case of setting the temperature of the substrate to a lower temperature than 160° C., the atomic ratio of a carbon element in the coating layer may be greater than 1%, and superhydrophobic property may not be obtained.

Figure 7:
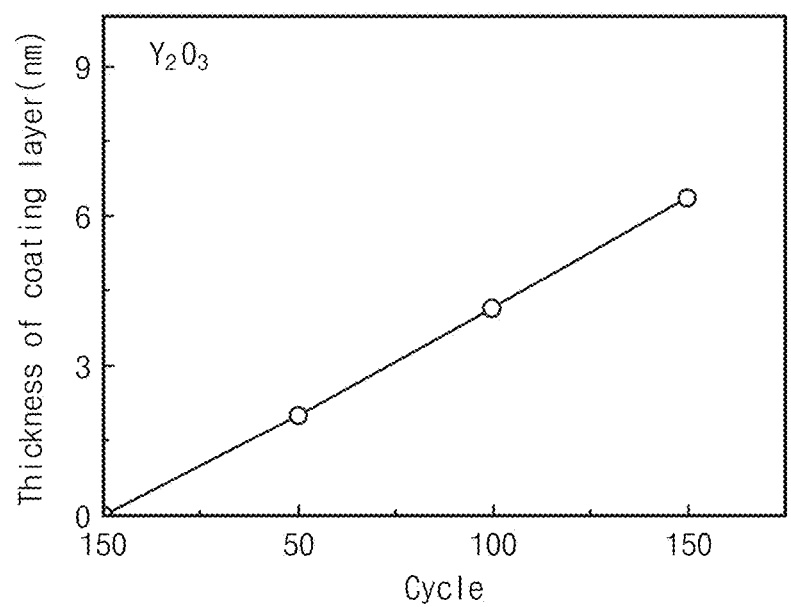
FIG. 7 is a graph showing a thickness of an yttrium oxide coating layer relative to cycle number.

FIG. 7 is a graph showing a thickness of an yttrium oxide coating layer relative to cycle number. In this case, the temperature of the substrate (120) was maintained to 180° C., and the exposure time of the precursor was set to 2 seconds. The thickness of the yttrium oxide coating layer was measured after 50, 100 and 150 cycles, and the remaining experimental conditions were the same as those of FIG. 4. Referring to FIG. 7, it would be found that the thickness of the yttrium oxide coating layer increased in proportion to the cycle number. Thus, the coating layer with a desired thickness may be formed by controlling the cycle number in the forming process of the coating layer including the steps of S11 to S14 of FIG. 1, and the thickness of the coating layer may be controlled by the unit of less than 0.1 nm.

EXAMPLE 1

An experiment for securing the formation of a superhydrophobic coating layer according to an embodiment of the inventive concept was conducted. A cycle of exposing an Si substrate in a reaction chamber to a Y(iPrCp)$_2$(N-iPr-amd) precursor for 2 seconds, purging impurities for 10 seconds, exposing the substrate to an H$_2$O oxidant for 0.5 seconds and purging impurities for 10 seconds again, was conducted for several times to form an yttrium metal oxide coating layer with a thickness of 50 nm. The bubbling temperature of the precursor and the oxidant was set to 130° C. The temperature of the substrate was set to 180° C. in an embodiment of the inventive concept and was set to 300° C. according to a comparative embodiment.

The contact angle of a droplet relative to the coating layer formed by an embodiment of the inventive concept was measured to secure the realization of superhydrophobic property. The contact angle is a value obtained by measuring an angle between the surface of the droplet in the droplet and the surface of the coating layer. If the contact angle increases, in simple language, as the droplet is not spread and has a spherical shape, the coating layer is evaluated to have superhydrophobic property. In this disclosure, a superhydrophobic coating layer is defined as a coating layer having a contact angle of greater than or equal to 150°.

Figure 8:
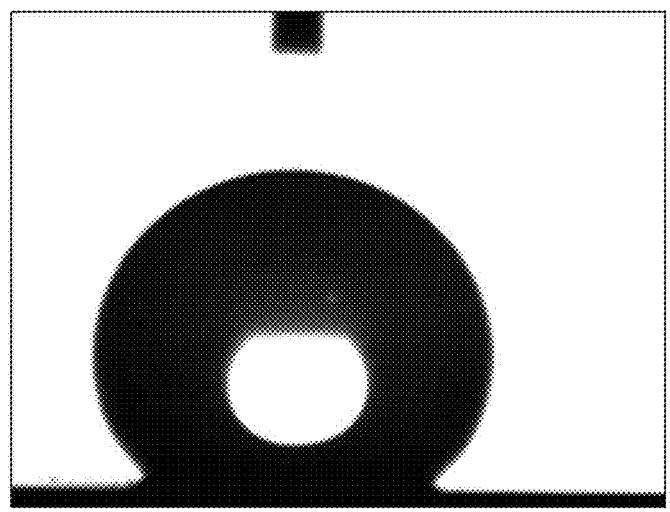
FIG. 8 is a photographic image showing a state of dropping a droplet on an yttrium oxide coating layer formed on the three-dimensional nano structure of a substrate according to an embodiment of the inventive concept.

FIG. 8 is a photographic image showing a state of dropping a droplet on an yttrium oxide coating layer formed on the three-dimensional nano structure of a substrate according to an embodiment of the inventive concept. From the result of measuring the contact angle of the droplet with respect to the yttrium oxide coating layer formed according to an embodiment of the inventive concept, the coating material forming the yttrium oxide coating layer on the three-dimensional nano structure according to an embodiment of the inventive concept has superhydrophobic property.

Figure 9:
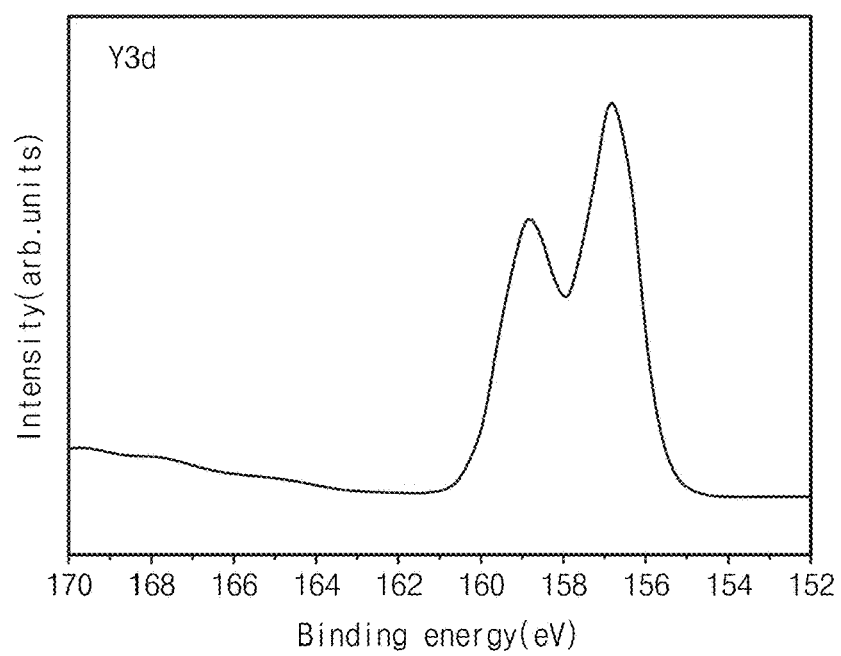
FIG. 9 is a graph obtained by measuring Y 3d binding energy of an yttrium oxide coating layer formed on a substrate according to an embodiment of the inventive concept.
Figure 10:
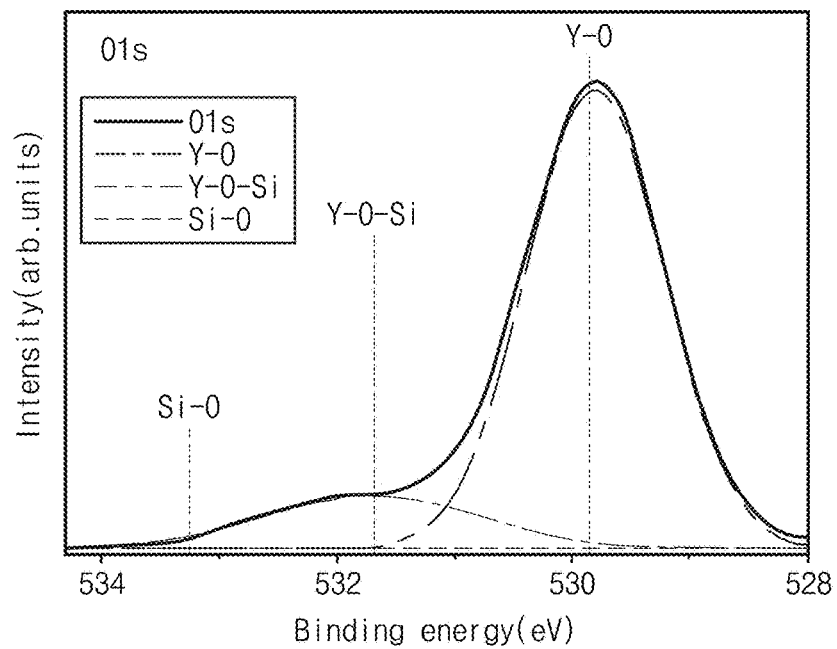
FIG. 10 is a graph obtained by measuring O 1s binding energy of an yttrium oxide coating layer formed on a substrate according to an embodiment of the inventive concept.
Figure 11:
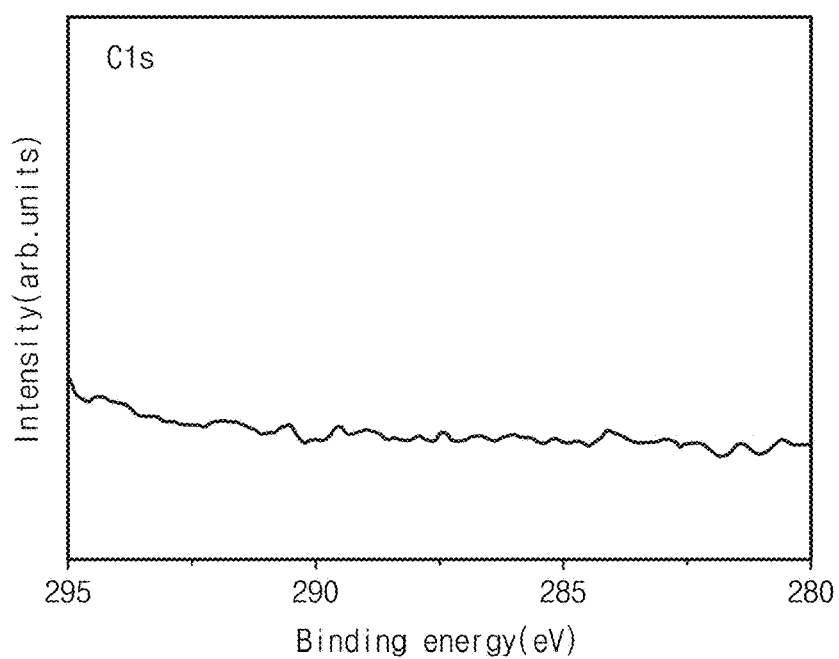
FIG. 11 is a graph obtained by measuring C 1s binding energy of an yttrium oxide coating layer formed on a substrate according to an embodiment of the inventive concept.
Figure 12:
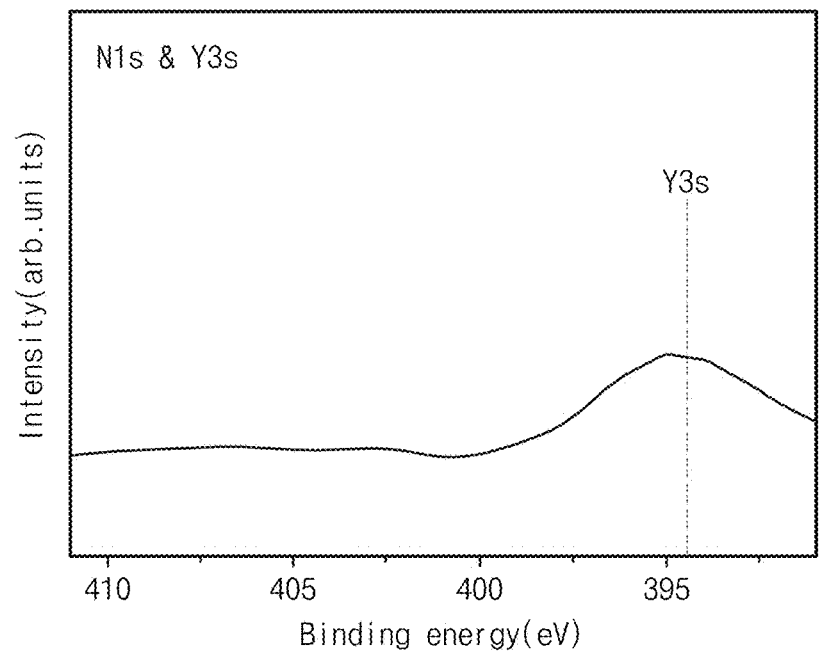
FIG. 12 is a graph obtained by measuring N 1s, Y 3s binding energy of an yttrium oxide coating layer formed on a substrate according to an embodiment of the inventive concept.

FIG. 9 is a graph obtained by measuring Y 3d binding energy of an yttrium oxide coating layer formed on a substrate according to an embodiment of the inventive concept, FIG. 10 is a graph obtained by measuring O 1s binding energy of an yttrium oxide coating layer formed on a substrate according to an embodiment of the inventive concept, FIG. 11 is a graph obtained by measuring C 1s binding energy of an yttrium oxide coating layer formed on a substrate according to an embodiment of the inventive concept, and FIG. 12 is a graph obtained by measuring N 1s, Y 3s binding energy of an yttrium oxide coating layer formed on a substrate according to an embodiment of the inventive concept.

The high peak intensity of the binding energy means the high ratio of a specific element showing the binding energy forming the peak, and the low peak intensity of the binding energy means the opposite. Accordingly, through the binding energy distribution, the atomic ratio of elements may be estimated. Referring to FIGS. 9 to 12, the peaks of C 1s, N 1s binding energy is rarely shown relative to the peaks of Y 3d, O 1s binding energy. By integrating and analyzing the distribution of the binding energy, the atomic ratio of a carbon element among elements constituting the coating layer was measured to be less than 1%, and the coating layer formed on the substrate provided with the three-dimensional nano structure according to an embodiment of the inventive concept exhibited superhydrophobic property.

Figure 13:
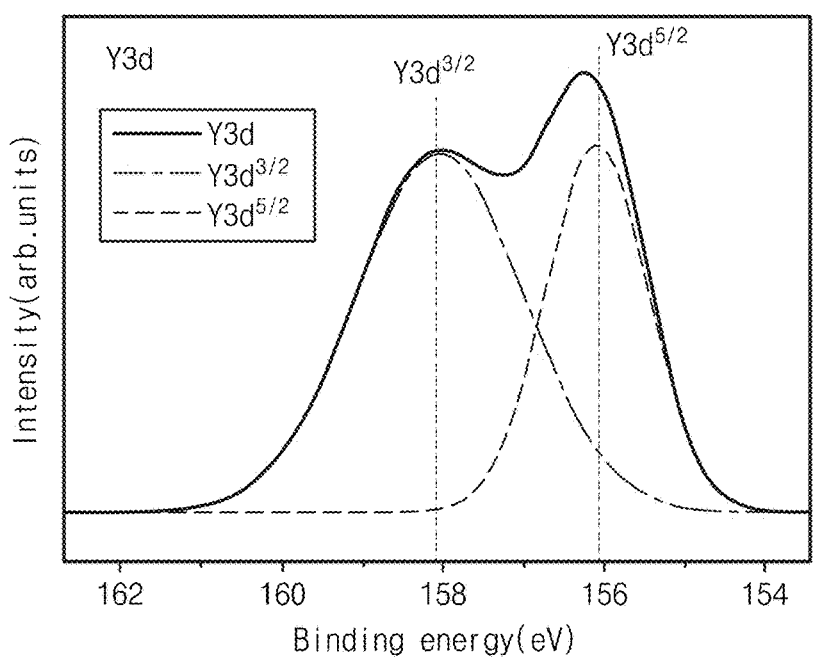
FIG. 13 is a graph obtained by measuring Y 3d binding energy of an yttrium oxide coating layer formed on a substrate according to a comparative embodiment.

From the result of measuring a contact angle by dropping a droplet on an yttrium oxide coating layer formed on a substrate according to the comparative example (the substrate temperature of 300° C.), the yttrium oxide coating layer formed according to the comparative example did not exhibit superhydrophobic property. FIG. 13 is a graph obtained by measuring Y 3d binding energy of an yttrium oxide coating layer formed on a substrate according to a comparative embodiment, FIG. 14 is a graph obtained by measuring O 1s binding energy of an yttrium oxide coating layer formed on a substrate according to a comparative example, and FIG. 15 is a graph obtained by measuring C 1s binding energy of an yttrium oxide coating layer formed on a substrate according to a comparative example.

Figure 14:
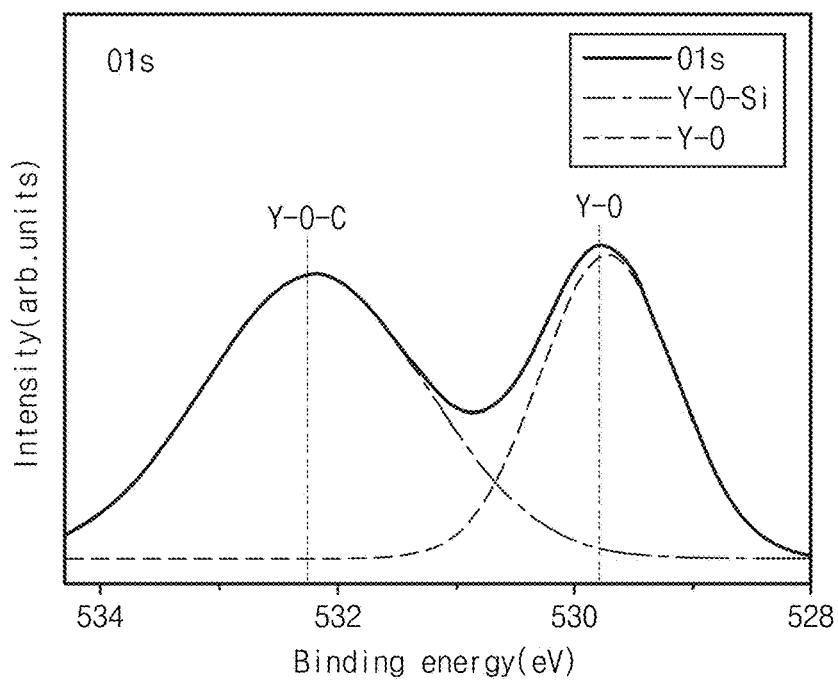
FIG. 14 is a graph obtained by measuring O 1s binding energy of an yttrium oxide coating layer formed on a substrate according to a comparative embodiment.
Figure 15:
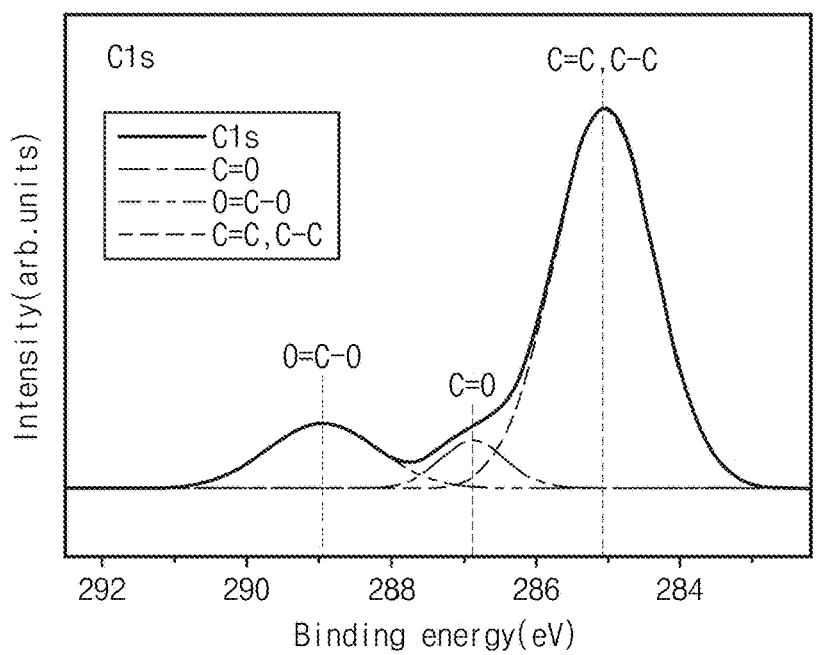
FIG. 15 is a graph obtained by measuring C 1s binding energy of an yttrium oxide coating layer formed on a substrate according to a comparative embodiment.

Referring to FIGS. 13 to 15, relatively high peaks are shown in Y—O—C, O=C—O, C=O, C=C, and C—C binding energy. By integrating and analyzing the distribution of the binding energy, the atomic ratio of Y:O:C was 27.8:38.6:33.7, and the atomic ratio of O/Y was 1.39. Thus, the atomic ratio of a carbon element was very high as not an $Y_2O_3$ coating layer but an YOC level, and thus, the coating layer formed on the substrate according to the comparative example did not have superhydrophobic property.

Figure 16:
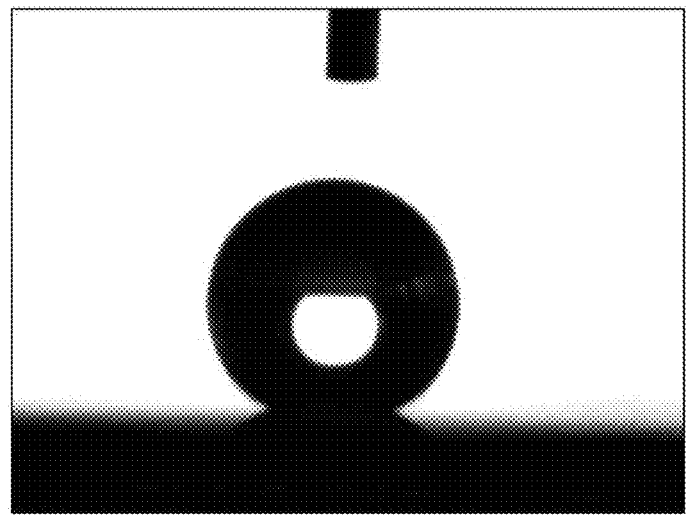
FIG. 16 is a photographic image showing a state of dropping a droplet after heat treatment at a high temperature on an yttrium oxide coating layer formed on a substrate provided with a three-dimensional nano structure according to an embodiment of the inventive concept.

To evaluate the stability at a high temperature of the yttrium oxide coating layer formed on the substrate according to an embodiment of the inventive concept, the yttrium oxide coating layer formed on the substrate was heat treated at 500° C. for 2 hours, and the contact angle of the coating layer was measured to evaluate superhydrophobic property. FIG. 16 is a photographic image showing a state of dropping a droplet after heat treatment at a high temperature on an yttrium oxide coating layer formed on a substrate provided with a three-dimensional nano structure according to an embodiment of the inventive concept. The contact angle of the coating layer and the droplet after heat treatment was 157°, and the contact angle was increased from that before the heat treatment. It means that the superhydrophobic coating material manufactured according to an embodiment of the inventive concept maintained the superhydrophobic property after heat treatment at a high temperature for a long time, and the superhydrophobic property were rather improved when compared to those before the heat treatment at a high temperature.

Figure 17:
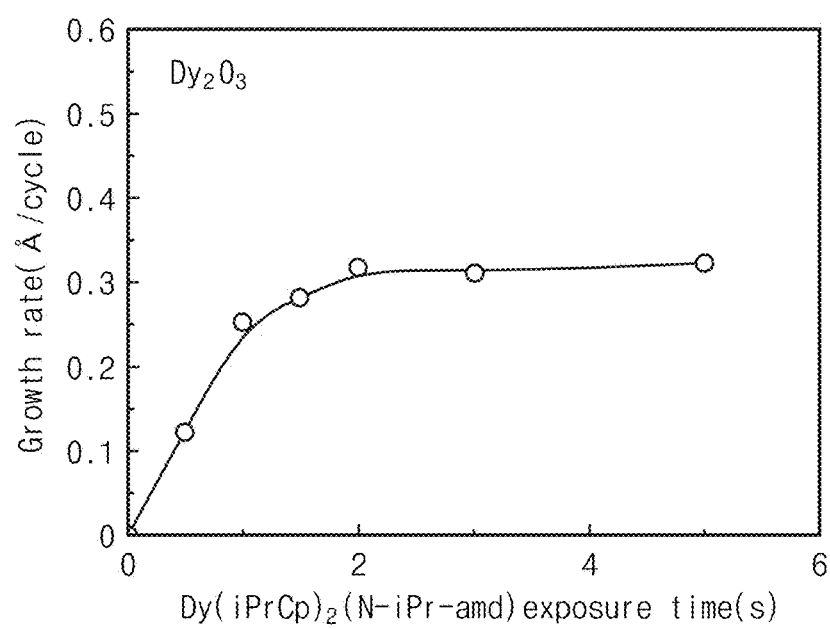
FIG. 17 is a graph showing a growth rate of a dysprosium oxide coating layer relative to exposure time of a substrate to a dysprosium precursor.

FIG. 17 is a graph showing a growth rate of a dysprosium oxide coating layer relative to exposure time of a substrate to a dysprosium precursor. An Si substrate was exposed to a $Dy(iPrCp)_2(N$-iPr-amd) precursor, impurities were purged for 10 seconds, the substrate was exposed to a plasma $O_2$ oxidant for 1 second and impurities were purged for 10 seconds again to form a dysprosium metal oxide coating layer. The temperature of the substrate was maintained at 180° C., and the bubbling temperature of the precursor and the oxidant was set to 120° C.

As shown in FIG. 17, in the case that the exposure time to the precursor is greater than or equal to 2 seconds, the growth rate of the dysprosium metal oxide coating layer is maintained to an appropriate level (about 0.3 Å/cycle). In order to secure the growth rate of the coating layer to a certain level, while decreasing process time, the exposure time to the dysprosium precursor may preferably be from 2 to 3 seconds.

Figure 18:
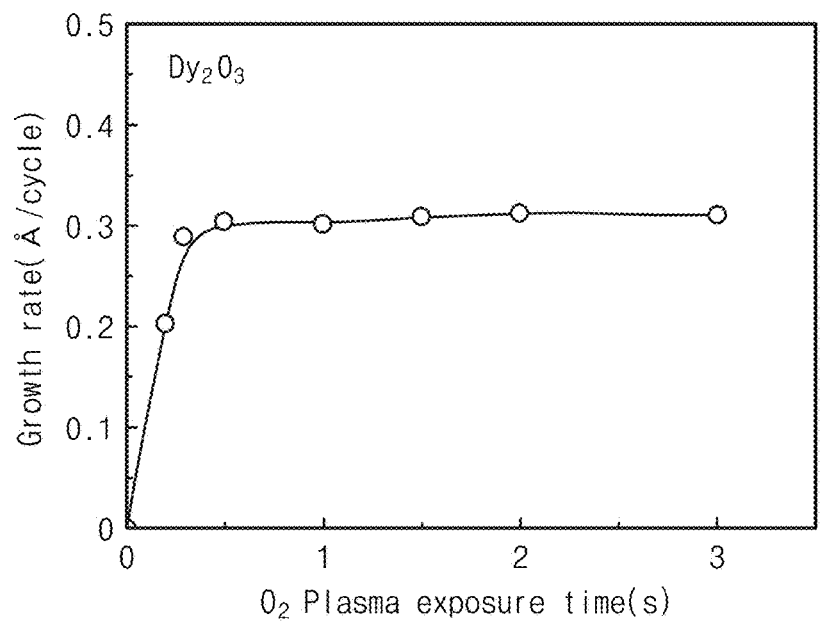
FIG. 18 is a graph showing a growth rate of a dysprosium oxide coating layer relative to exposure time of a substrate to a dysprosium precursor.

FIG. 18 is a graph showing a growth rate of a dysprosium oxide coating layer relative to exposure time of a substrate to a dysprosium precursor. The exposure time of the dysprosium precursor was set to 2 seconds, and other experimental conditions were set to the same experimental conditions as those of FIG. 17. As shown in FIG. 18, if the exposure time to the oxidant was greater than or equal to 0.5 seconds, the growth rate of the dysprosium metal oxide coating layer per cycle was maintained to an appropriate level (about 0.3 Å/cycle). In order to secure the growth rate of the coating layer to a certain level, while decreasing process time, the exposure time to the oxidant may preferably be from 0.5 seconds to 1 second.

Figure 19:
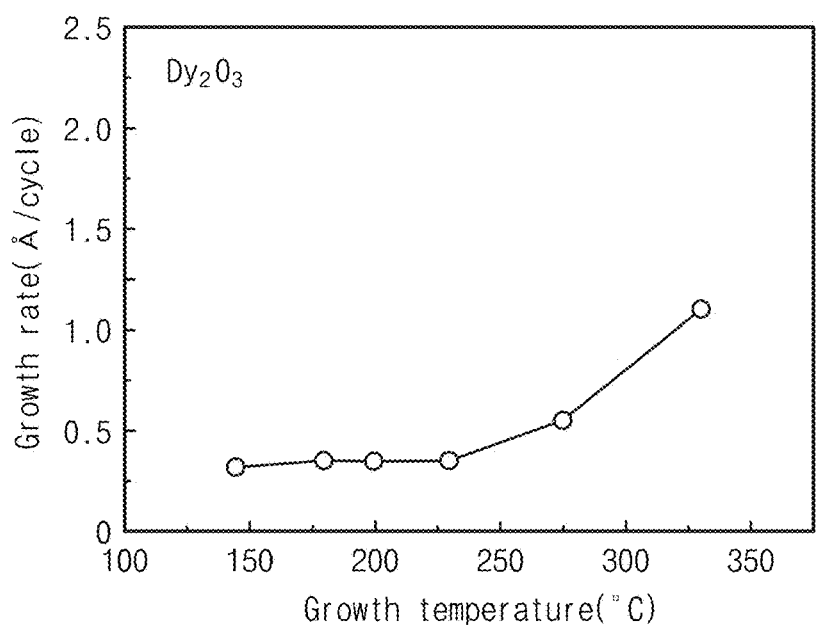
FIG. 19 is a graph showing a growth rate of a dysprosium oxide coating layer relative to the growth temperature (the temperature of a substrate) of a coating layer.

FIG. 19 is a graph showing a growth rate of a dysprosium oxide coating layer relative to the growth temperature (the temperature of a substrate) of a coating layer. The supply time (exposure time) of the precursor was set to 2 seconds, and the exposure time to the oxidant was set to 1 second. Other experimental conditions were set to the same experimental conditions as those of FIG. 17. As shown in FIG. 19, if the dysprosium precursor was used and the temperature of the substrate was in a range of from 145 to 230° C., the growth rate of the coating layer was secured to an appropriate level.

If the temperature of the substrate is set to the temperatures (275° C., 325° C.) greater than 230° C., the growth rate of the dysprosium oxide coating layer is increased. This result is obtained, because impurities other than dysprosium oxide are included in the coating layer. That is, if the temperature is greater than 230° C., the atomic ratio of a carbon element among elements constituting the coating layer may be greater than or equal to 1%, and the coating layer thus formed may not have superhydrophobic property.

Figure 20:
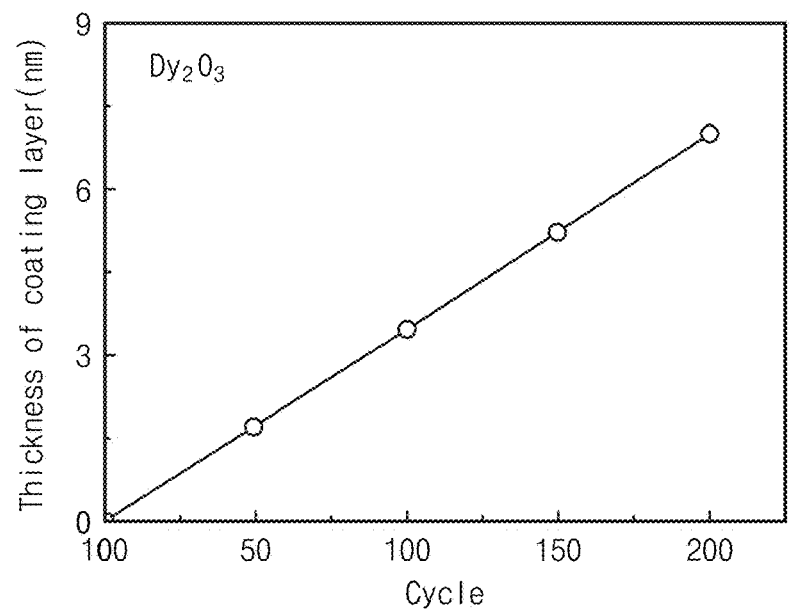
FIG. 20 is a graph showing a thickness of a dysprosium oxide coating layer relative to cycle number.

FIG. 20 is a graph showing a thickness of a dysprosium oxide coating layer relative to cycle number. In this case, the temperature of the substrate was maintained at 180° C., and the exposure time of the precursor was set to 2 seconds. The thickness of the dysprosium oxide coating layer was measured after performing 50, 100, 150 and 200 cycles, and the other experimental conditions were the same as those of FIG. 17. Referring to FIG. 20, the thickness of the dysprosium oxide coating layer increased in proportion to the cycle number. Accordingly, a coating layer with a desired thickness may be formed by controlling the cycle number during the forming process of the coating layer including the steps of S11 to S14 of FIG. 1.

EXAMPLE 2

An experiment for securing the formation of a superhydrophobic coating layer according to an embodiment of the inventive concept was conducted. A cycle of exposing an Si substrate in a reaction chamber to a $Dy(iPrCp)_2(N$-iPr-amd) precursor for 2 seconds, purging impurities for 10 seconds, exposing the substrate to a plasma $O_2$ oxidant for 1 second and purging impurities for 10 seconds again, was conducted for several times to form a dysprosium metal oxide coating layer. The bubbling temperature of the precursor and the oxidant was set to 120° C., and the temperature of the substrate was set to 180° C. The dysprosium metal oxide coating layer formed according to an embodiment of the inventive concept has superhydrophobic property.

Figure 21:
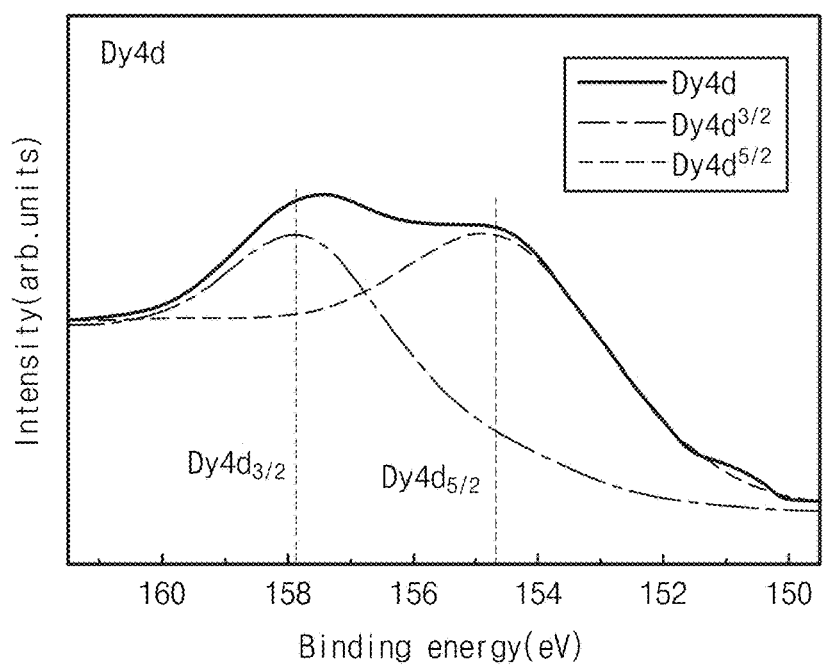
FIG. 21 is a graph obtained by measuring Dy 4d binding energy of a dysprosium oxide coating layer formed on a substrate according to an embodiment of the inventive concept.
Figure 22:
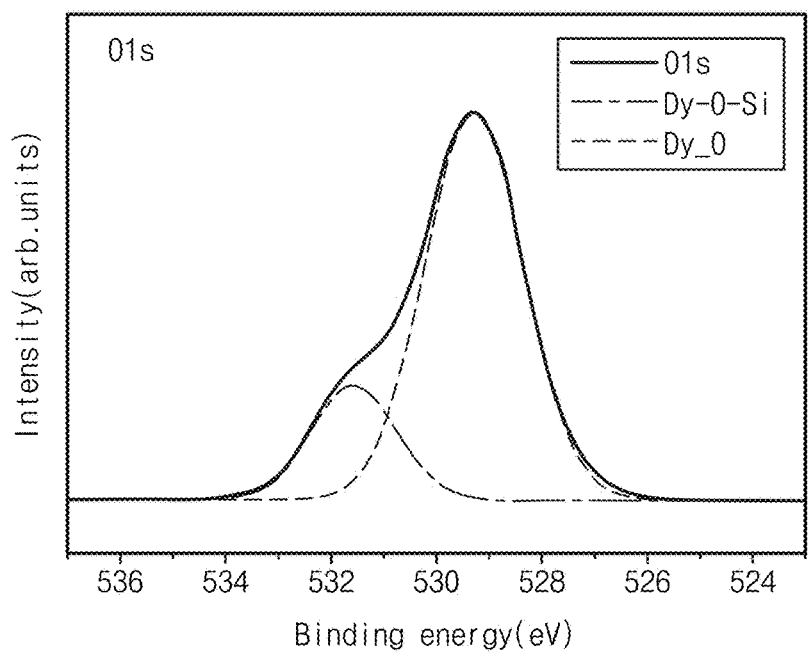
FIG. 22 is a graph obtained by measuring O 1s binding energy of a dysprosium oxide coating layer formed on a substrate according to an embodiment of the inventive concept.
Figure 23:
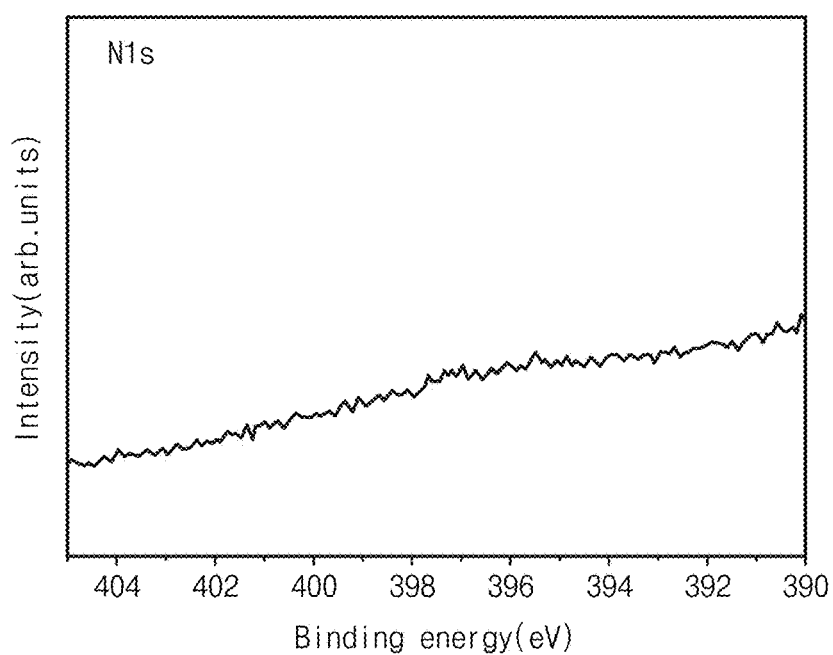
FIG. 23 is a graph obtained by measuring N 1s binding energy of a dysprosium oxide coating layer formed on a substrate according to an embodiment of the inventive concept.
Figure 24:
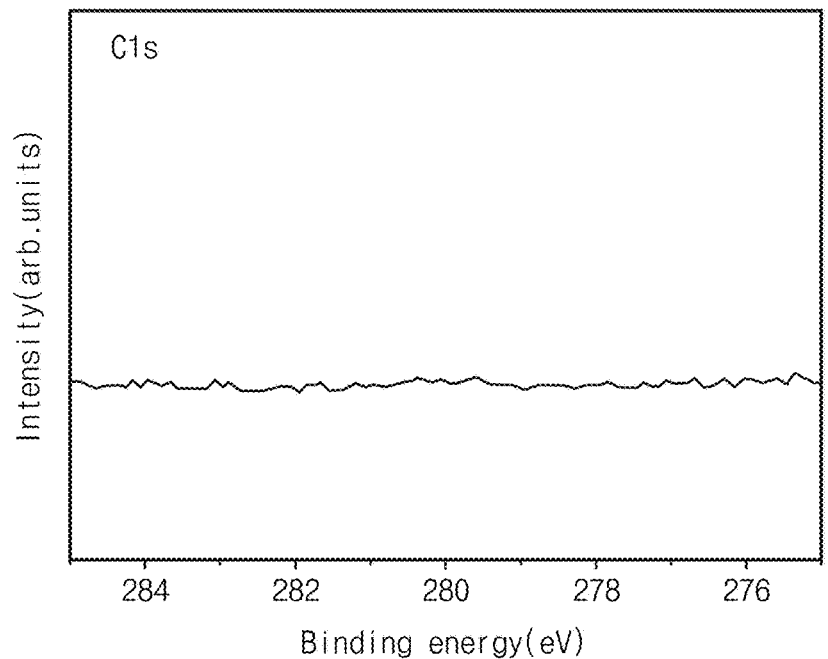
FIG. 24 is a graph obtained by measuring C 1s binding energy of a dysprosium oxide coating layer formed on a substrate according to an embodiment of the inventive concept.

FIG. 21 is a graph obtained by measuring Dy 4d binding energy of a dysprosium oxide coating layer formed on a substrate according to an embodiment of the inventive concept, FIG. 22 is a graph obtained by measuring O 1s binding energy of a dysprosium oxide coating layer formed on a substrate according to an embodiment of the inventive concept, FIG. 23 is a graph obtained by measuring N 1s binding energy of a dysprosium oxide coating layer formed on a substrate according to an embodiment of the inventive concept, and FIG. 24 is a graph obtained by measuring C 1s binding energy of a dysprosium oxide coating layer formed on a substrate according to an embodiment of the inventive concept.

Referring to FIGS. 21 to 24, the peaks of N 1s, C 1s binding energy are rarely shown relative to the peaks of Dy 4s, O 1s binding energy. From the results obtained by integrating and analyzing the distribution of the binding energy, the atomic ratio of a carbon element among elements constituting the coating layer was measured to be less than 1%, and the dysprosium oxide coating layer formed on the substrate provided with the three-dimensional nano structure according to an embodiment of the inventive concept exhibited superhydrophobic property.

In order to evaluate the stability at a high temperature of the dysprosium oxide coating layer formed on the substrate according to an embodiment of the inventive concept, the dysprosium oxide coating layer formed on the substrate was heat treated at 500° C. for 2 hours, and the contact angle of the coating layer was measured to evaluate superhydrophobic property. The superhydrophobic property of the coating layer was secured to be maintained after the heat treatment at a high temperature.

Figure 25:
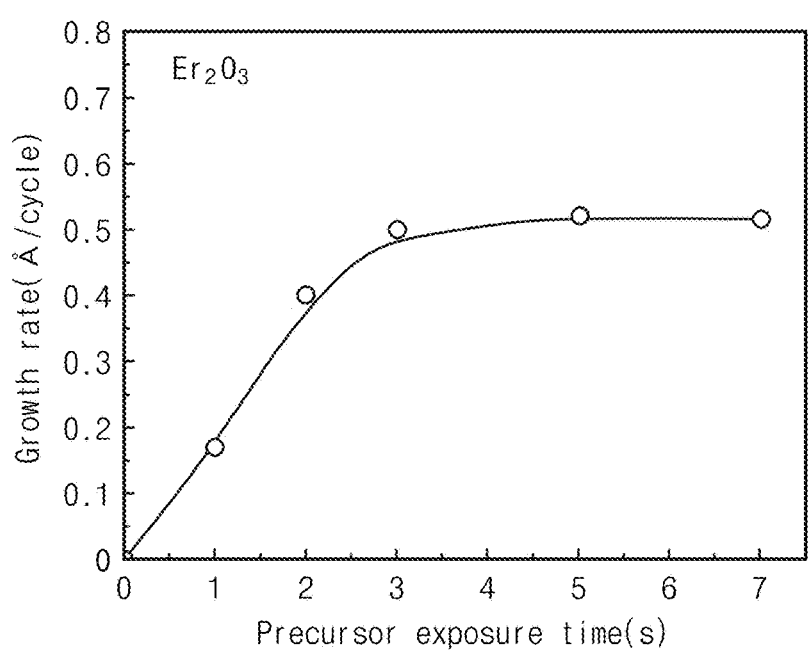
FIG. 25 is a graph showing a growth rate of an erbium oxide coating layer relative to exposure time of a substrate to an erbium precursor.

FIG. 25 is a graph showing a growth rate of an erbium oxide coating layer relative to exposure time of a substrate to an erbium precursor. An Si substrate was exposed to an Er(MeCp)$_2$(N-iPr-amd) precursor, impurities were purged for 10 seconds, the substrate was exposed to an H$_2$O oxidant for 1 second, and the impurities were purged again for 10 seconds to form an erbium metal oxide coating layer. The temperature of the substrate was maintained at 180° C., and the bubbling temperature of the precursor and the oxidant was set to 110° C.

As shown in FIG. 25, if the exposure time to the precursor is greater than or equal to 3 seconds, the growth rate of the erbium metal oxide coating layer is maintained to an appropriate level (about 0.5 Å/cycle). In order to secure the growth rate of the coating layer to a certain level, while decreasing process time, the exposure time to the erbium precursor may preferably be from 3 to 5 seconds. To maintain the growth rate of the erbium metal oxide coating layer to an appropriate level, the exposure time to an H$_2$O oxidant may preferably be greater than or equal to 1 second.

Figure 26:
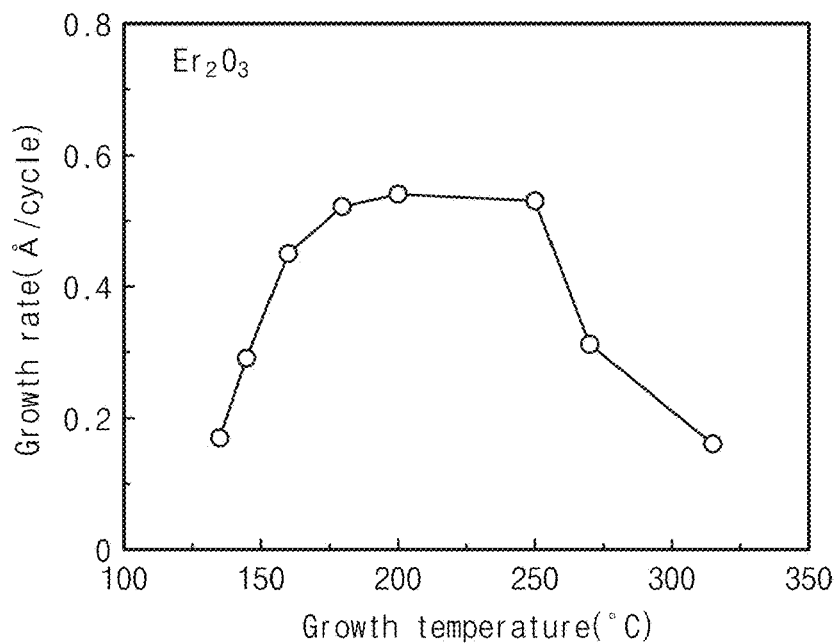
FIG. 26 is a graph showing a growth rate of an erbium oxide coating layer relative to the growth temperature (the temperature of a substrate) of a coating layer.

FIG. 26 is a graph showing a growth rate of an erbium oxide coating layer relative to the growth temperature (the temperature of a substrate) of a coating layer. The supply time (exposure time) of the precursor was set to 3 seconds, and the exposure time of the oxidant was set to 1 second. Other experimental conditions were the same as those of FIG. 25. As shown in FIG. 26, if the erbium precursor was used, and the temperature of the substrate was in a range of from 180 to 250° C., an appropriate growth rate of the coating layer was secured.

In the case of setting the temperature of the substrate to the temperatures (270° C., 320° C.) greater than 250° C., or the temperatures (130° C., 150° C., 160° C.) lower than 180° C., the growth rate of the erbium oxide coating layer was decreased. It is supposed that impurities were included in the coating layer instead of the erbium oxide, and the deposition of the erbium oxide was inhibited. That is, if the temperature of the substrate is deviated from an appropriate temperature, the atomic ratio of a carbon element among elements constituting the coating layer is increased to greater than or equal to 1%, and the coating layer thus formed may not have superhydrophobic property.

Figure 27:
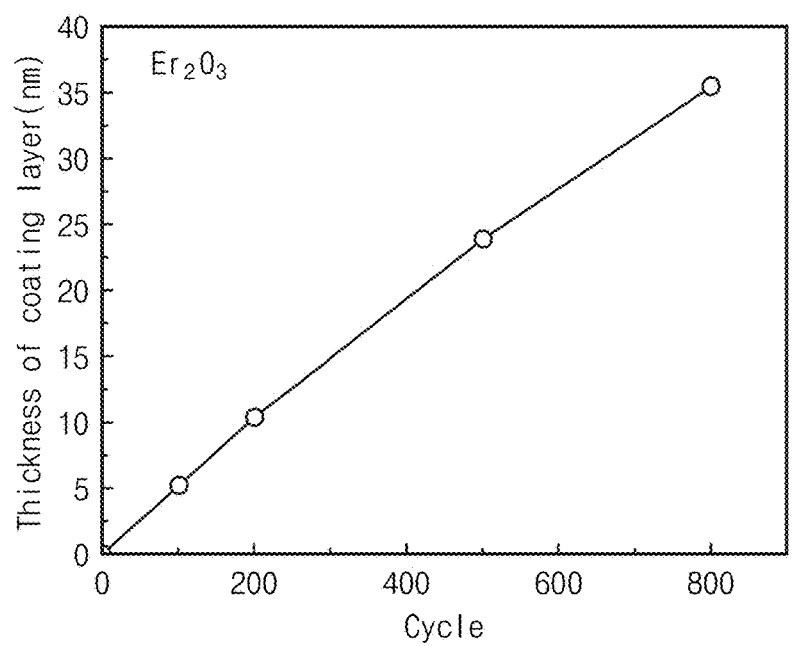
FIG. 27 is a graph showing a thickness of an erbium oxide coating layer relative to cycle number.

FIG. 27 is a graph showing a thickness of an erbium oxide coating layer relative to cycle number. In this case, the temperature of the substrate was maintained at 180° C., and the exposure time of the precursor was set to 3 seconds. The thickness of the erbium oxide coating layer was measured after performing 100, 200, 500 and 800 cycles, and the other experimental conditions were the same as those of FIG. 25. Referring to FIG. 27, the thickness of the erbium oxide coating layer increases in proportion to the cycle number. Thus, a coating layer with a desired thickness may be formed by controlling the cycle number during the forming process of the coating layer including the steps of S11 to S14 of FIG. 1.

EXAMPLE 3

An experiment for securing the formation of a superhydrophobic coating layer according to an embodiment of the inventive concept was conducted. A cycle of exposing an Si substrate in a reaction chamber to an Er(MeCp)$_2$(N-iPr-amd) precursor for 3 seconds, purging impurities for 10 seconds, exposing the substrate to an H$_2$O oxidant for 1 second and purging impurities again for 10 seconds, was conducted for several times to form an erbium metal oxide coating layer. The bubbling temperature of the precursor and the oxidant was set to 110° C., and the temperature of the substrate was set to 180° C. The erbium metal oxide coating layer formed according to an embodiment of the inventive concept has superhydrophobic property.

Figure 28:
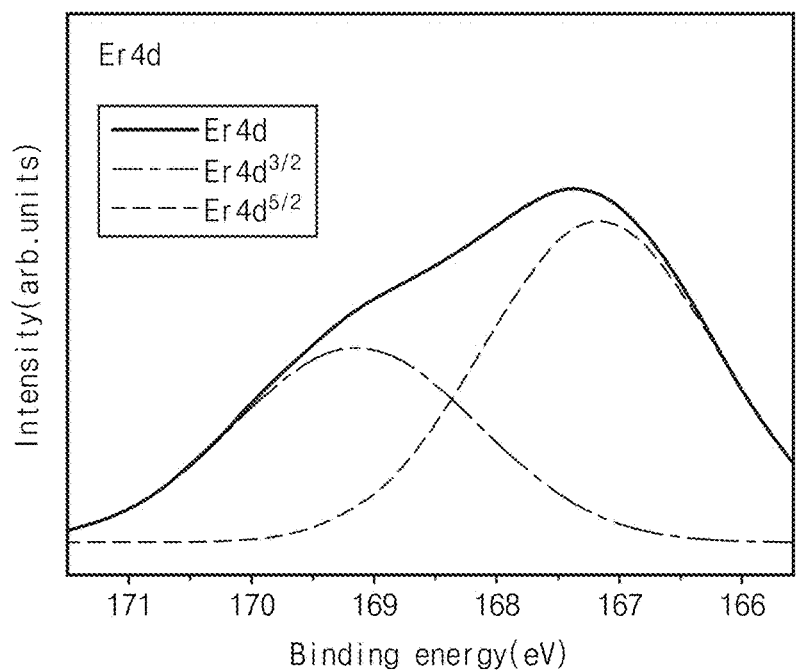
FIG. 28 is a graph obtained by measuring Er 4d binding energy of an erbium oxide coating layer formed on a substrate according to an embodiment of the inventive concept.
Figure 29:
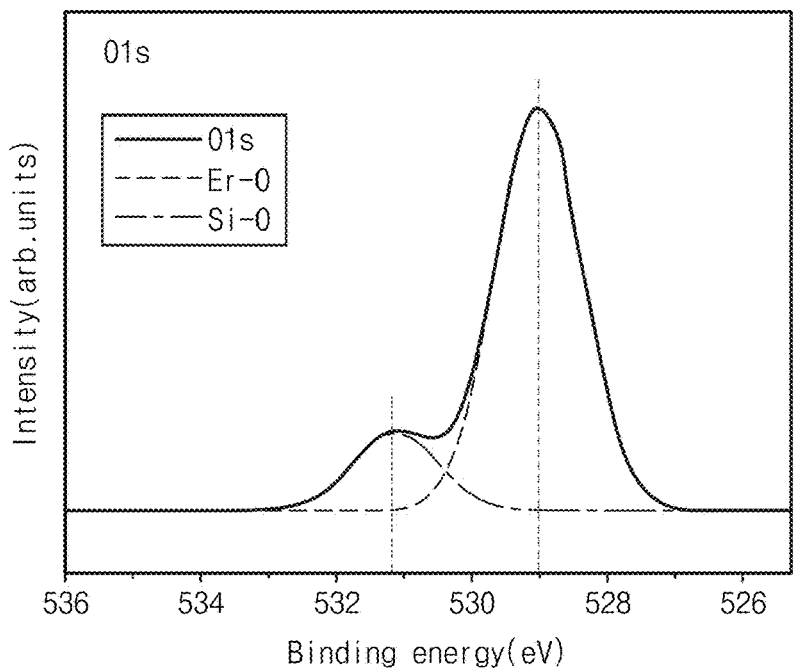
FIG. 29 is a graph obtained by measuring O 1s binding energy of an erbium oxide coating layer formed on a substrate according to an embodiment of the inventive concept.
Figure 30:
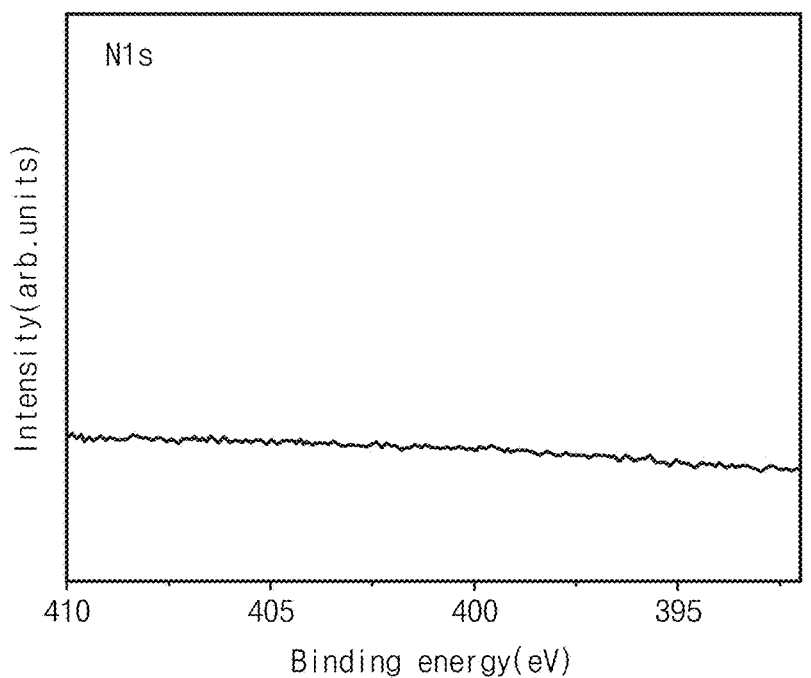
FIG. 30 is a graph obtained by measuring N 1s binding energy of an erbium oxide coating layer formed on a substrate according to an embodiment of the inventive concept.
Figure 31:
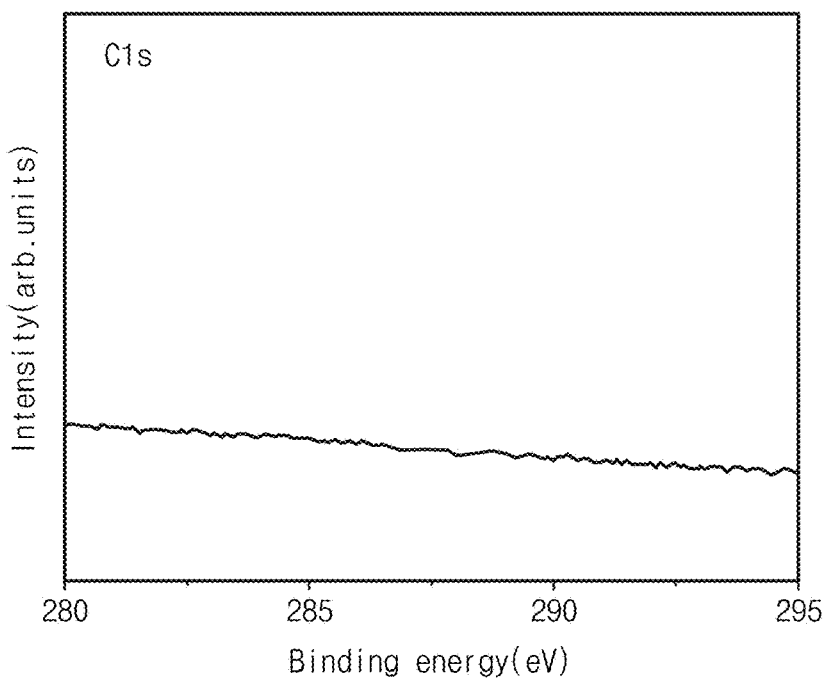
FIG. 31 is a graph obtained by measuring C 1s binding energy of an erbium oxide coating layer formed on a substrate according to an embodiment of the inventive concept.

FIG. 28 is a graph obtained by measuring Er 4d binding energy of an erbium oxide coating layer formed on a substrate according to an embodiment of the inventive concept, FIG. 29 is a graph obtained by measuring O 1s binding energy of an erbium oxide coating layer formed on a substrate according to an embodiment of the inventive concept, FIG. 30 is a graph obtained by measuring N 1s binding energy of an erbium oxide coating layer formed on a substrate according to an embodiment of the inventive concept, and FIG. 31 is a graph obtained by measuring C 1s is binding energy of an erbium oxide coating layer formed on a substrate according to an embodiment of the inventive concept.

Referring to FIGS. 28 to 31, the peaks of N 1s, C 1s binding energy are rarely shown relative to the peaks of Er 4d, O 1s binding energy. From the results obtained by integrating and analyzing the distribution of the binding energy, the atomic ratio of a carbon element among elements constituting the coating layer was measured to be less than 1%, and the erbium oxide coating layer formed on the substrate according to an embodiment of the inventive concept exhibited superhydrophobic property.

In order to evaluate the stability at a high temperature of the erbium oxide coating layer according to an embodiment of the inventive concept, the erbium oxide coating layer formed on the substrate was heat treated at 500° C. for 2 hours, and the contact angle of the coating layer was measured to evaluate the superhydrophobic property. The superhydrophobic property of the coating layer was secured to be maintained after the heat treatment at a high temperature.

Figure 32:
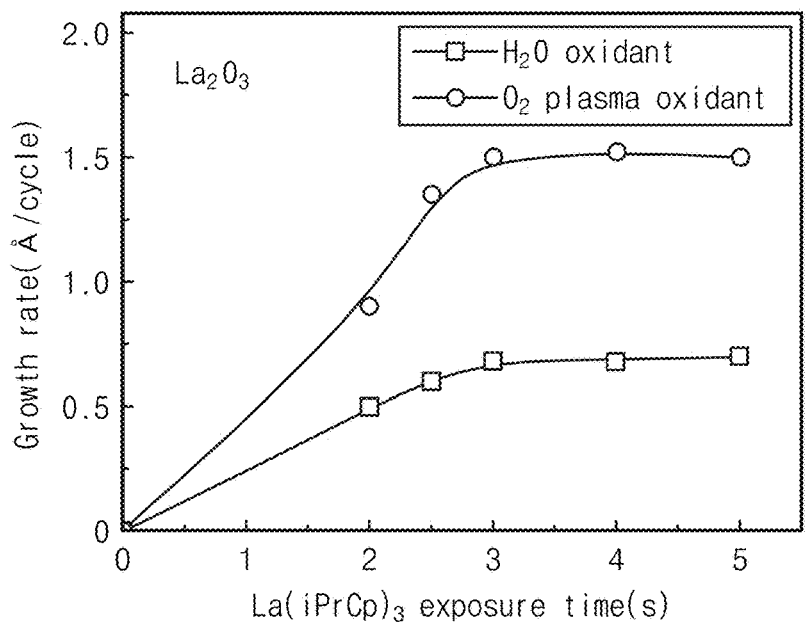
FIG. 32 is a graph showing a growth rate of a lanthanum oxide coating layer relative to exposure time of a substrate to a lanthanum precursor.

FIG. 32 is a graph showing a growth rate of a lanthanum oxide coating layer relative to exposure time of a substrate to a lanthanum precursor. An Si substrate was exposed to an La(iPrCp)$_3$ precursor, impurities were purged for 10 seconds, the substrate was exposed to an oxidant for 1 second, and the impurities were purged again for 10 seconds to form a lanthanum metal oxide coating layer. The temperature of the substrate was maintained at 300° C. As the oxidant, H$_2$O and plasma O$_2$ were used, and the growth rate of the coating layer was measured for each oxidant.

As shown in FIG. 32, in the case that the exposure time to the precursor is greater than or equal to 3 seconds, it may be found that the growth rate of the lanthanum metal oxide coating layer was maintained to an appropriate level. In order to secure the growth rate of the coating layer to a certain level, while decreasing process time, the exposure time to the erbium precursor may preferably be from 3 to 4 seconds. To maintain the growth rate of the lanthanum metal oxide coating layer to an appropriate level, the exposure time of an oxidant may preferably be greater than or equal to 3 seconds.

Figure 33:
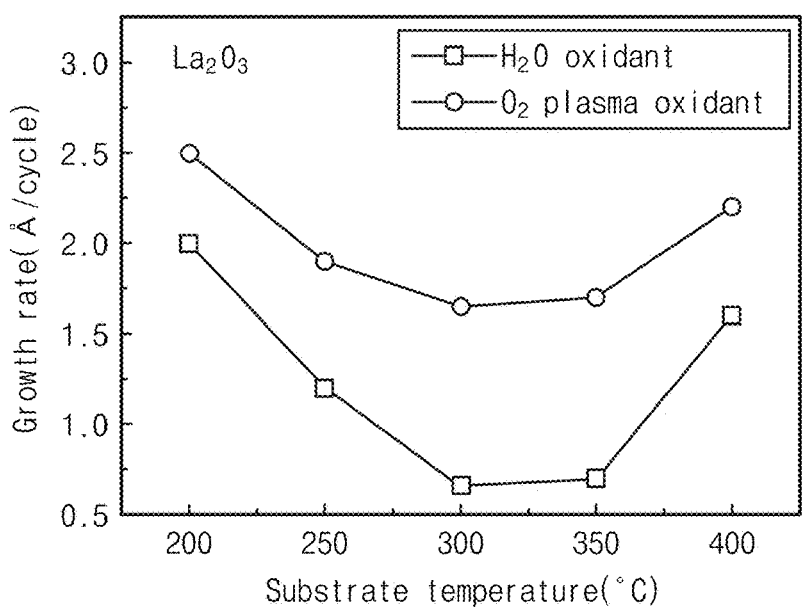
FIG. 33 is a graph showing a growth rate of a lanthanum oxide coating layer relative to the growth temperature (the temperature of a substrate) of a coating layer.

FIG. 33 is a graph showing a growth rate of a lanthanum oxide coating layer relative to the growth temperature (the temperature of a substrate) of a coating layer. The supply times (exposure times) of the precursor and the oxidant were set to 3 seconds and 1 second, respectively, and other experimental conditions were the same as those of FIG. 32. As shown in FIG. 33, if the lanthanum precursor was used, and the temperature of the substrate was in a range of from 250 to 350° C., an appropriate growth rate of the coating layer was secured.

In the case of setting the temperature of the substrate to the temperature (400° C.) greater than 350° C., or the temperature (200° C.) lower than 250° C., the growth rate of the lanthanum oxide coating layer was increased. It is supposed that impurities other than the lanthanum oxide were included in the coating layer. That is, if the temperature of the substrate is deviated from an appropriate temperature, the atomic ratio of a carbon element among elements constituting the coating layer is increased to greater than or equal to 1%, and the coating layer thus formed may not have superhydrophobic property.

EXAMPLE 4

An experiment for securing the formation of a superhydrophobic coating layer according to an embodiment of the inventive concept was conducted. A cycle of exposing an Si substrate in a reaction chamber to an $La(iPrCp)_3$ precursor for 3 seconds, purging impurities for 10 seconds, exposing the substrate to an $H_2O$ or plasma $O_2$ oxidant for 1 second and purging impurities again for 10 seconds, was conducted for several times to form a lanthanum metal oxide coating layer. The temperature of the substrate was set to 300° C. The lanthanum metal oxide coating layer formed according to an embodiment of the inventive concept exhibited superhydrophobic property.

Figure 34:
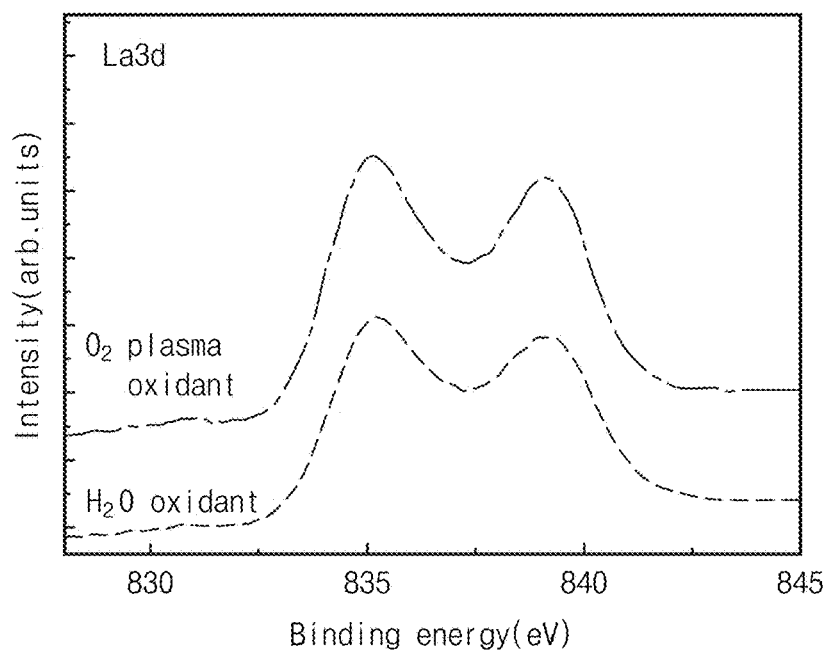
FIG. 34 is a graph obtained by measuring La 3d binding energy of a lanthanum oxide coating layer formed on a substrate according to an embodiment of the inventive concept.
Figure 35:
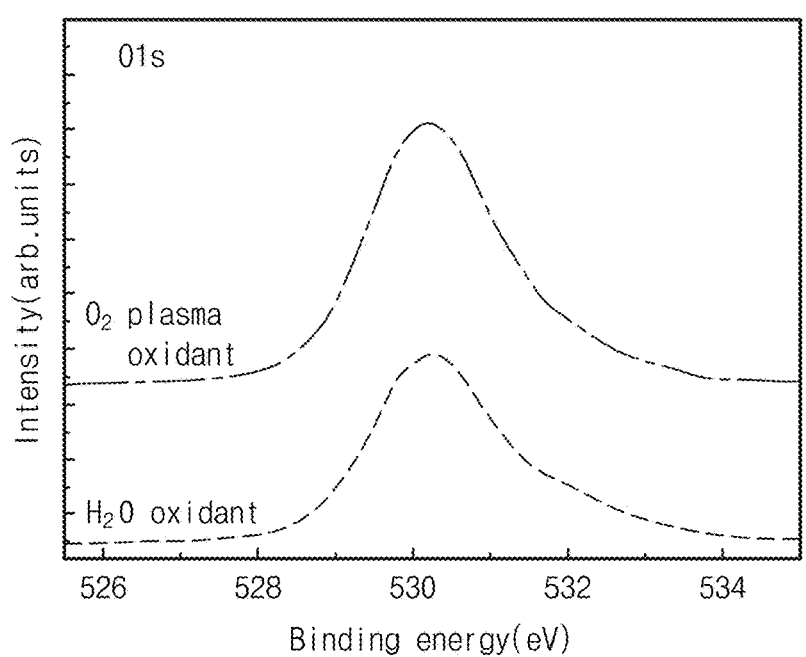
FIG. 35 is a graph obtained by measuring O 1s binding energy of a lanthanum oxide coating layer formed on a substrate according to an embodiment of the inventive concept.

FIG. 34 is a graph obtained by measuring La 3d binding energy of a lanthanum oxide coating layer formed on a substrate according to an embodiment of the inventive concept, and FIG. 35 is a graph obtained by measuring O 1s binding energy of a lanthanum oxide coating layer formed on a substrate according to an embodiment of the inventive concept. By integrating and analyzing the distribution of the binding energy, the atomic ratio of a carbon element among elements constituting the coating layer was measured to be less than 1%, and the lanthanum oxide coating layer formed on the substrate provided with the three-dimensional nano structure according to an embodiment of the inventive concept exhibited superhydrophobic property.

Figure 36:
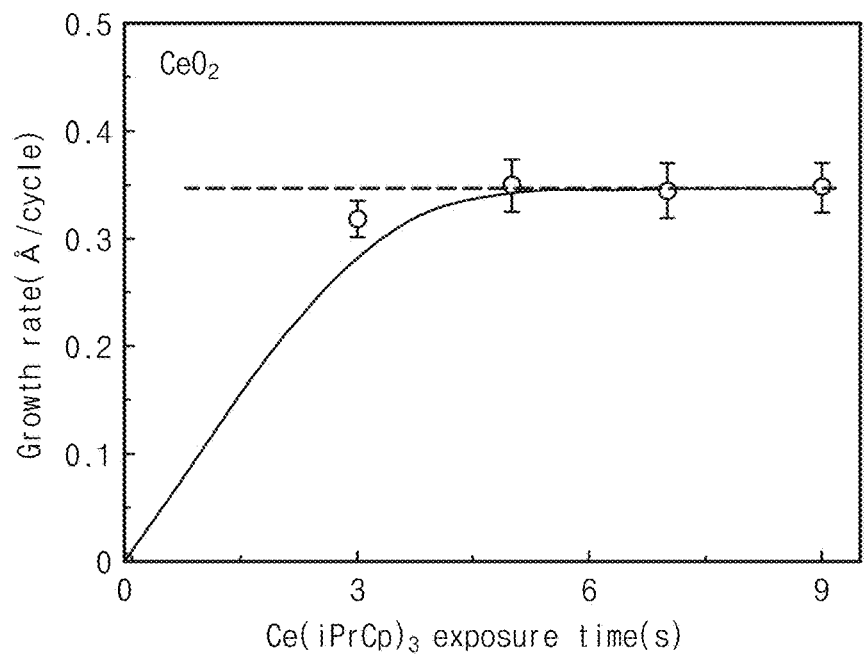
FIG. 36 is a graph showing a growth rate of a cerium oxide coating layer relative to exposure time of a substrate to a cerium precursor.

FIG. 36 is a graph showing a growth rate of a cerium oxide coating layer relative to exposure time of a substrate to a cerium precursor. An Si substrate was exposed to a $Ce(iPrCp)_3$ precursor, impurities were purged for 10 seconds, the substrate was exposed to a plasma $O_2$ oxidant for 1 second, and the impurities were purged again for 10 seconds to form a cerium metal oxide coating layer. The temperature of the substrate was maintained at 250° C.

As shown in FIG. 36, if the exposure time to the precursor is greater than or equal to 4 seconds, more preferably greater than or equal to 5 seconds, the growth rate of the cerium metal oxide coating layer per cycle was maintained to an appropriate level. In order to secure the growth rate of the coating layer to a certain level, while decreasing process time, the exposure time to the cerium precursor may preferably be from 4 to 7 seconds. To maintain the growth rate of the cerium metal oxide coating layer to an appropriate level, the exposure time to the plasma $O_2$ oxidant may preferably be greater than or equal to 1 second.

Figure 37:
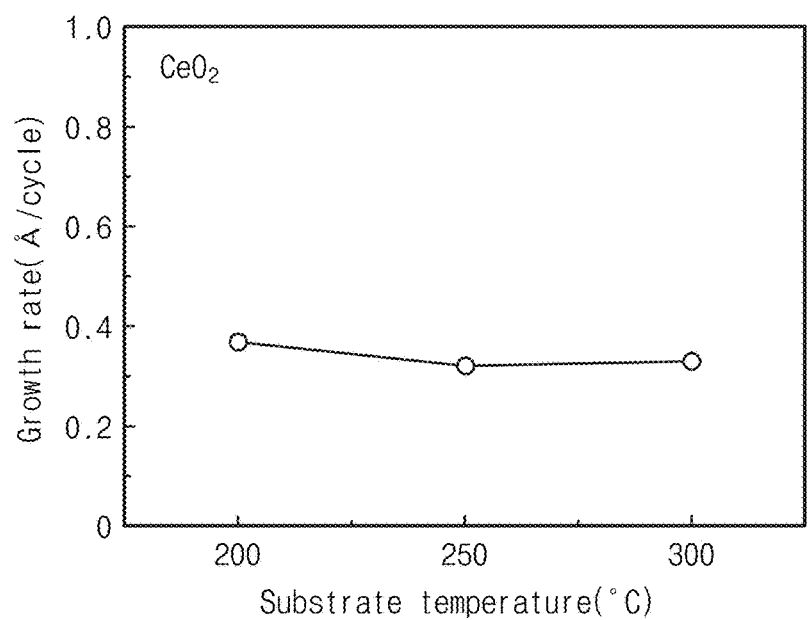
FIG. 37 is a graph showing a growth rate of a cerium oxide coating layer relative to the growth temperature (the temperature of a substrate) of a coating layer.

FIG. 37 is a graph showing a growth rate of a cerium oxide coating layer relative to the growth temperature (the temperature of a substrate) of a coating layer. The supply times (exposure times) of the precursor and the oxidant were set to 4 seconds and 1 second, respectively, and other experimental conditions were the same as those of FIG. 36. As shown in FIG. 37, if the cerium precursor was used, and the temperature of the substrate was in a range of from 200 to 300° C., an appropriate growth rate of the coating layer was secured. If the temperature of the substrate is deviated from an appropriate temperature, impurities other than the cerium oxide may be included in the coating layer, and the atomic ratio of a carbon element among elements constituting the coating layer may be increased to greater than or equal to 1%, and the coating layer thus formed may not have superhydrophobic property.

EXAMPLE 5

An experiment for securing the formation of a superhydrophobic coating layer according to an embodiment of the inventive concept was conducted. A cycle of exposing an Si substrate in a reaction chamber to a $Ce(iPrCp)_3$ precursor for 4 seconds, purging impurities for 10 seconds, exposing the substrate to a plasma $O_2$ oxidant for 1 second and purging impurities again for 10 seconds, was conducted for several times to form a cerium metal oxide coating layer. The temperature of the substrate was set to 250° C. The cerium metal oxide coating layer formed on the substrate provided with the three-dimensional nano structure according to an embodiment of the inventive concept exhibited superhydrophobic property.

Figure 38:
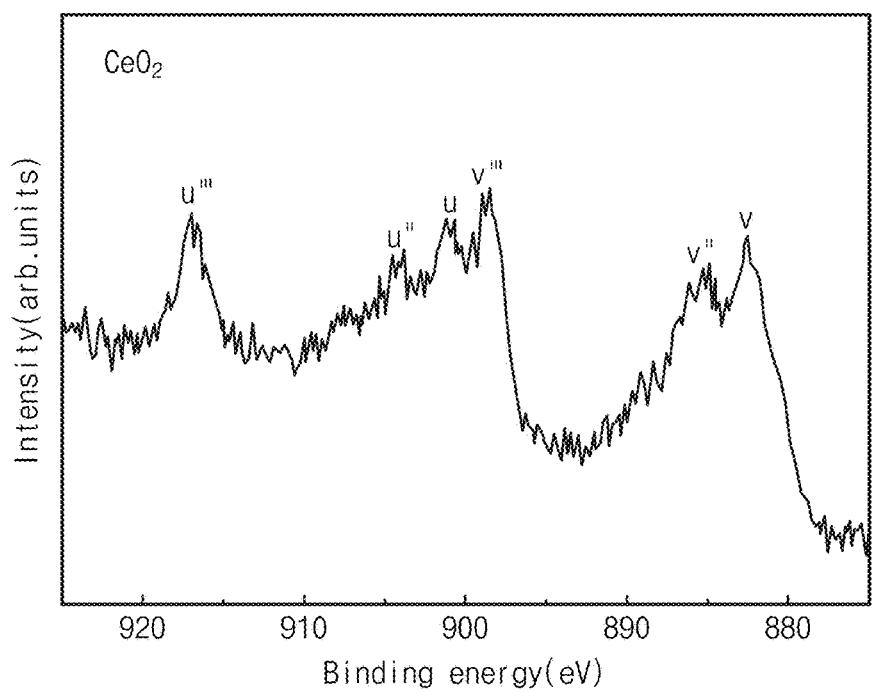
FIG. 38 is a graph obtained by measuring Ce 3d binding energy of a cerium oxide coating layer formed on a substrate according to an embodiment of the inventive concept.
Figure 39:
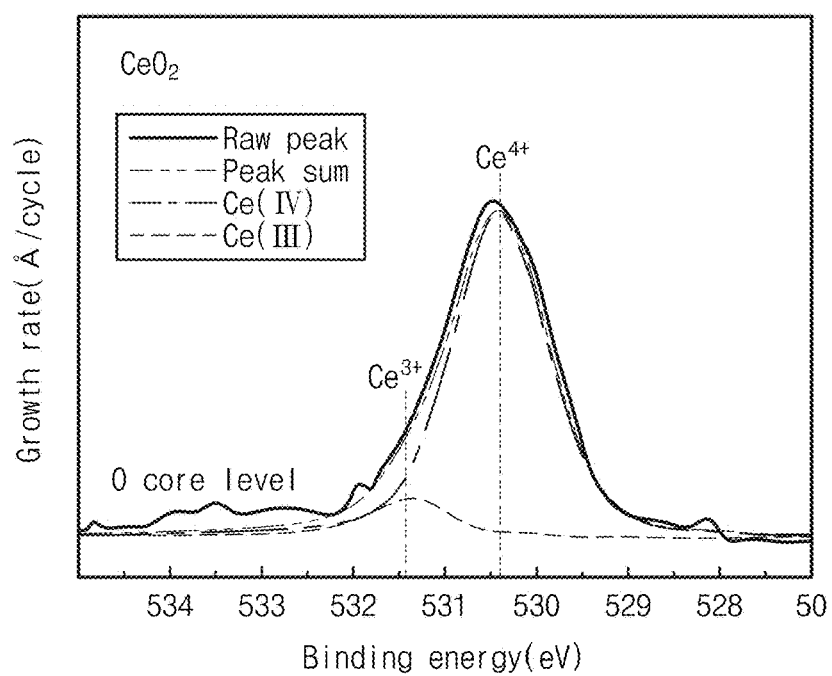
FIG. 39 is a graph obtained by measuring O 1s binding energy of a cerium oxide coating layer formed on a substrate according to an embodiment of the inventive concept.
Figure 40:
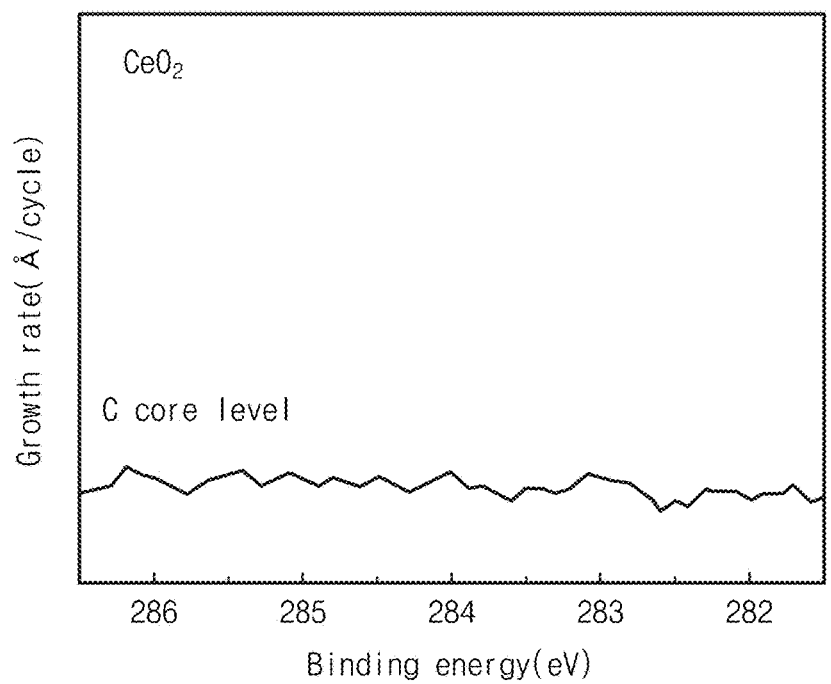
FIG. 40 is a graph obtained by measuring C 1s binding energy of a cerium oxide coating layer formed on a substrate according to an embodiment of the inventive concept.

FIG. 38 is a graph obtained by measuring Ce 3d binding energy of a cerium oxide coating layer formed on a substrate according to an embodiment of the inventive concept, FIG. 39 is a graph obtained by measuring O 1s binding energy of a cerium oxide coating layer formed on a substrate according to an embodiment of the inventive concept, and FIG. 40 is a graph obtained by measuring C 1s binding energy of a cerium oxide coating layer formed on a substrate according to an embodiment of the inventive concept.

Referring to FIGS. 38 to 40, the peak of C 1s is binding energy is rarely shown relative to the peaks of Ce 3d, O 1s binding energy. From the results obtained by integrating and analyzing the distribution of the binding energy, the atomic ratio of a carbon element among elements constituting the coating layer was measured to be less than 1%, and the cerium oxide coating layer formed on the substrate provided with the three-dimensional nano structure according to an embodiment of the inventive concept exhibited superhydrophobic property.

Figure 41:
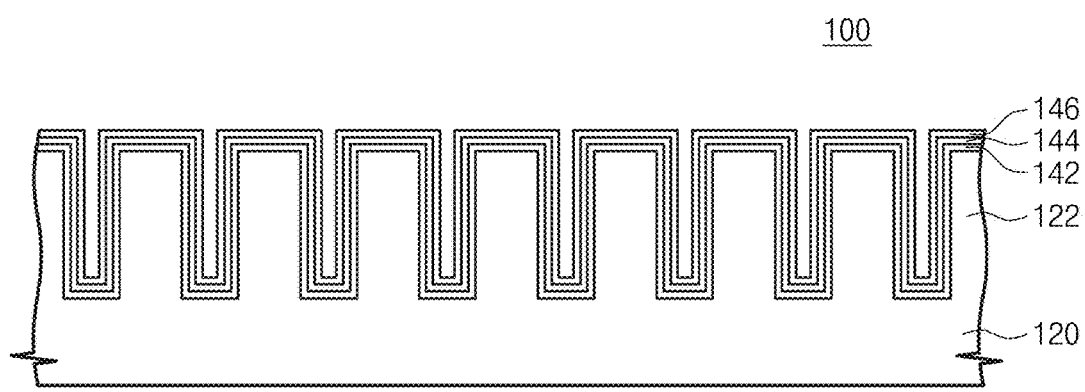
FIG. 41 is a cross-sectional view schematically showing a superhydrophobic coating material according to an embodiment of the inventive concept.

FIG. 41 is a cross-sectional view schematically showing a superhydrophobic coating material according to an embodiment of the inventive concept. Referring to FIG. 41, a plurality of coating layers (142, 144, 146) may be formed on the three-dimensional nano structure (122) of the substrate (120). The plurality of the coating layers (142, 144, 146) may be formed using the same oxide of a rare earth element, or oxides of different kinds of rare earth elements. The uppermost coating layer (146) may be formed as a rare earth metal oxide layer having superhydrophobic property. The coating layers (142, 144) between the uppermost coating layer (146) and the substrate (120) may be coating layers not including the rare earth metal oxide.

Figure 42:
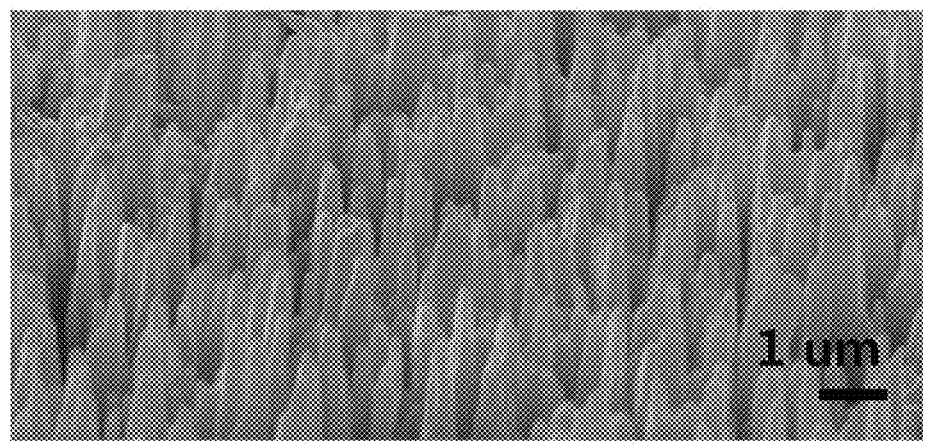
FIG. 42 is an enlarged photographic image showing the formation of a rare earth oxide thin film on a substrate provided with a three-dimensional nano structure (silicon nano wires) according to an embodiment of the inventive concept.

FIG. 42 is an enlarged photographic image showing the formation of a rare earth oxide thin film on a substrate provided with a three-dimensional nano structure (silicon nano wires) according to an embodiment of the inventive concept. If the rare earth oxide thin film coating layer is not uniformly deposited on the silicon nano wire, two materials may be separated by heat due to the difference of thermal expansion coefficients between the silicon nano wire and the oxide thin film, thereby deteriorating hydrophobic property. However, according to an embodiment of the inventive concept, an oxide thin film coating layer may be uniformly formed on the three-dimensional nano structure by an atomic layer deposition method. Therefore, the superhydrophobic property may be maintained after applying heat to the coating material.

The coating material manufactured according to an embodiment of the inventive concept has superhydrophobic property. The superhydrophobic coating material manufactured according to an embodiment of the inventive concept has thermal stability at a high temperature, and maintains the superhydrophobic property even after heat treatment at 500° C. for 2 hours. According to an embodiment of the inventive concept, superhydrophobic coating with transparency, friction durability, abrasion-resistance, and stability at a high temperature may be manufactured, and through the realization of superhydrophobic surface coating on diverse three-dimensional structure, the coating material may be applied to various fields such as a solar cell, automobile parts, cuisine products, etc.

The superhydrophobic coating material according to an embodiment of the inventive concept may be applied to various products including, for example, a transparent or non-reflective coating material, a coating material for limiting humidity of an electronic device, a fiber material not getting wet in water, a separating membrane of water and oil, a superhydrophobic valve, an anticorrosive coating agent of a metal surface by water, a battery, an application material of a fossil fuel, kitchen utensils with antibacterial property, a coating agent of a surgical equipment, glass for automobiles, etc.

The above-disclosed example embodiments are suggested to assist the understanding of the inventive concept and are not restrict the scope of the inventive concept, however various modifiable embodiments fall within the scope of the inventive concept. The technical scope for protection of the inventive concept is to be determined by the technical spirit of claims, and the technical scope for protection of the inventive concept is not limited to the literal description of claims, however the technical values thereof is to be broadened substantially to the invention within equivalent scope.

EXPLANATION OF DESIGNATED NUMERALS

100: Superhydrophobic coating material
120: Substrate
122: Three-dimensional nano structure
140, 142, 144, 146: Coating layers

The invention claimed is:

1. A method for manufacturing a superhydrophobic coating material by an atomic layer deposition, the method comprising:
   preparing a substrate provided with a three-dimensional nano structure; and
   forming a coating layer comprising a rare earth metal oxide on the three-dimensional nano structure by supplying a precursor including a rare earth metal and an oxidant one by one onto the substrate,
   wherein the forming of the coating layer comprises:
   (a) supplying the precursor including the rare earth metal onto the substrate;
   (b) purging impurities of remaining precursor after the combination of the rare earth metal onto the substrate;
   (c) supplying the oxidant onto the substrate; and
   (d) purging remaining impurities after forming the coating layer including the rare earth metal oxide on the substrate,
   wherein a coating layer with superhydrophobic property is formed by repeating the steps of (a) to (d),
   wherein the forming of the coating layer is conducted by controlling the temperature of the substrate so that an atomic ratio of a carbon element in the coating layer is less than 1% to form a coating layer with superhydrophobic property,
   wherein the rare earth metal comprises yttrium, and
   the forming of the coating layer is conducted by controlling the temperature of the substrate to 160 to 170° C. so that an atomic ratio of a carbon element in the coating layer is less than 1% to form a coating layer with superhydrophobic property, and
   wherein a contact angle of the coating layer with water is greater than 150°, and superhydrophobic property is maintained after heat treatment at a temperature of 500° C. for 2 hours.

2. The method for manufacturing a superhydrophobic coating material of claim 1,
   wherein the oxidant comprises at least one selected from $H_2O$ and plasma O2.

* * * * *

UNITED STATES PATENT AND TRADEMARK OFFICE
CERTIFICATE OF CORRECTION

PATENT NO. : 10,392,701 B2
APPLICATION NO. : 14/815797
DATED : August 27, 2019
INVENTOR(S) : Hyungjun Kim, Il-Kwon Oh and Han-Bo-Ram Lee It is certified that error appears in the above-identified patent and that said Letters Patent is hereby corrected as shown below:

On the Title Page

Item [73], insert:
--INDUSTRY-ACADEMIC COOPERATION FOUNDATION, YONSEI UNIVERSITY
Seoul, KR
INCHEON UNIVERSITY INDUSTRY ACADEMIC COOPERATION FOUNDATION
Incheon, KR--

Signed and Sealed this
Twelfth Day of May, 2020

Andrei Iancu
*Director of the United States Patent and Trademark Office*